United States Patent
Lin et al.

(10) Patent No.: US 11,043,487 B2
(45) Date of Patent: Jun. 22, 2021

(54) ESD PROTECTION CIRCUIT, SEMICONDUCTOR SYSTEM INCLUDING SAME, AND METHOD FOR OPERATING SAME

(71) Applicant: TAIWAN SEMICONDUCTOR MANUFACTURING COMPANY LTD., Hsinchu (TW)

(72) Inventors: Wan-Yen Lin, Kaohsiung (TW); Bo-Ting Chen, Fengyuan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 112 days.

(21) Appl. No.: 16/527,783

(22) Filed: Jul. 31, 2019

(65) Prior Publication Data

US 2020/0075580 A1    Mar. 5, 2020

Related U.S. Application Data

(60) Provisional application No. 62/725,206, filed on Aug. 30, 2018.

(51) Int. Cl.
    *H01L 27/02*    (2006.01)
(52) U.S. Cl.
    CPC .............................. *H01L 27/0285* (2013.01)
(58) Field of Classification Search
    CPC combination set(s) only.
    See application file for complete search history.

(56) References Cited

U.S. PATENT DOCUMENTS

| | | | |
|---|---|---|---|
| 5,910,873 A * | 6/1999 | Boluna | H02H 9/046 361/111 |
| 6,249,410 B1 * | 6/2001 | Ker | H01L 27/0251 361/111 |
| 6,388,850 B1 | 5/2002 | Ker et al. | |
| 7,260,442 B2 | 8/2007 | Hwang et al. | |
| 7,420,793 B2 | 9/2008 | Huang et al. | |
| 7,518,192 B2 | 4/2009 | Yu et al. | |
| 7,672,101 B2 | 3/2010 | Lin et al. | |

(Continued)

FOREIGN PATENT DOCUMENTS

| KR | 20010029848 | 4/2001 |
|---|---|---|
| KR | 100343914 | 7/2002 |

(Continued)

OTHER PUBLICATIONS

Office Action dated Jul. 29, 2020 from corresponding application No. TW 108131412.

(Continued)

*Primary Examiner* — Nduka E Ojeh
(74) *Attorney, Agent, or Firm* — Hauptman Ham, LLP

(57) ABSTRACT

An electrostatic discharge (ESD) protection circuit (for a protected device in a semiconductor system, the protected device being coupled between a first node and a first reference voltage) includes: an ESD device coupled between the first node and the first reference voltage; a logic block including a first input and an output, the first input being coupled to a second reference voltage, and the output being coupled to an input of the ESD device and a feedback control circuit coupled between the first node and a second input of the logic block.

20 Claims, 18 Drawing Sheets

(56) References Cited

U.S. PATENT DOCUMENTS

| | | |
|---|---|---|
| 8,854,778 B2 | 10/2014 | Chu et al. |
| 9,256,709 B2 | 2/2016 | Yu et al. |
| 9,473,116 B1 * | 10/2016 | Wang .................... H03K 3/037 |
| 2003/0067726 A1 | 4/2003 | Voldman |
| 2010/0033884 A1 | 2/2010 | Fan et al. |
| 2013/0120880 A1 | 5/2013 | Kuo |
| 2013/0249046 A1 * | 9/2013 | Chou .................. H01L 27/0266 |
| | | 257/500 |
| 2014/0040838 A1 | 2/2014 | Liu et al. |
| 2014/0268439 A1 | 9/2014 | Su et al. |
| 2015/0278429 A1 | 10/2015 | Chang |

FOREIGN PATENT DOCUMENTS

| | | |
|---|---|---|
| TW | 201227909 | 7/2012 |
| TW | 201240518 | 10/2012 |
| TW | 201244048 | 11/2012 |
| TW | 201817143 | 5/2018 |

OTHER PUBLICATIONS

Office Action dated Oct. 21, 2020 for corresponding case No. TW 10-921009100 (pp. 1-4).

Notice of Allowance dated Feb. 19, 2021 for corresponding case No. KR 10-2019-0106817. English translation attached on p. 1. (pp. 1-6).

* cited by examiner

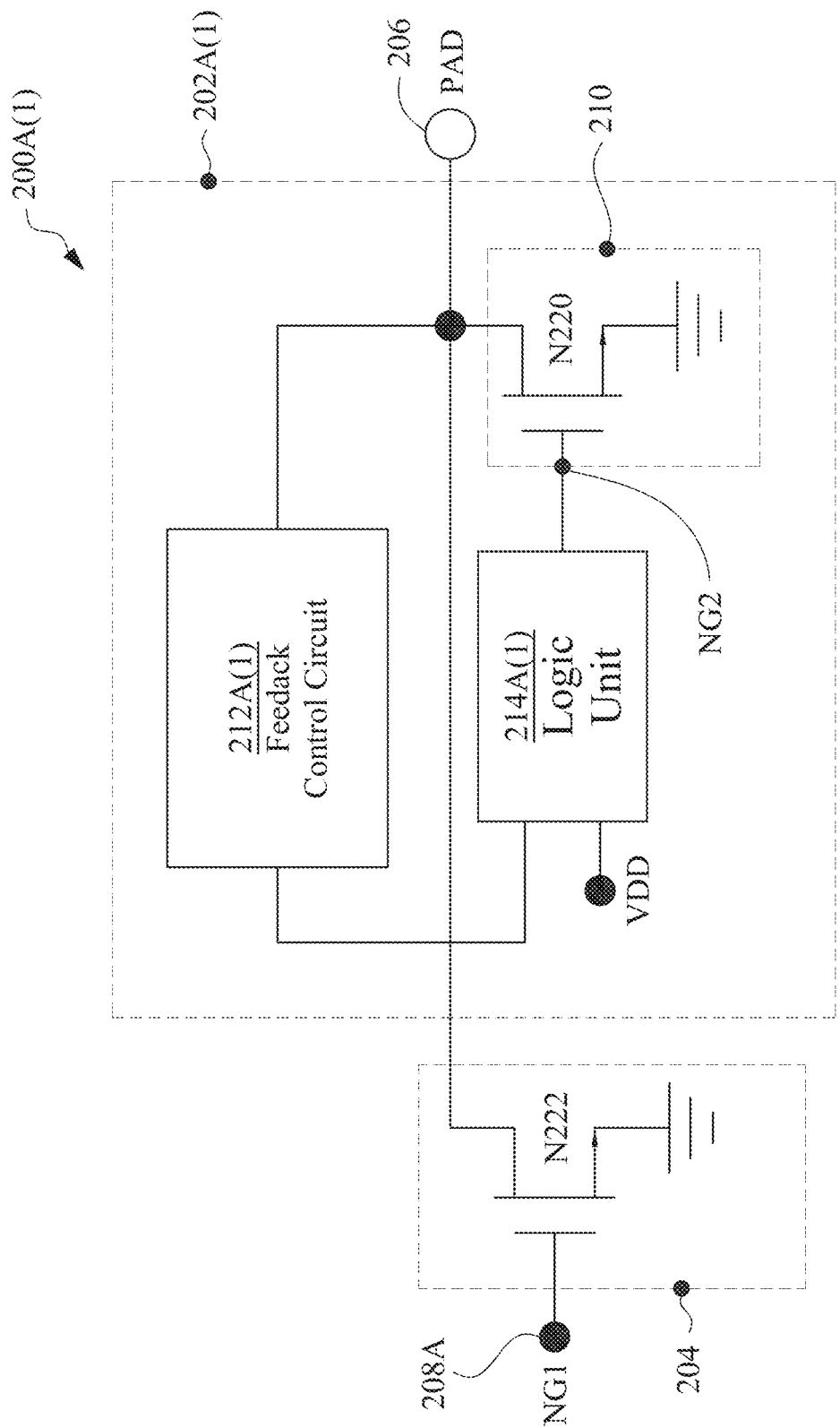
FIG. 2A(1)

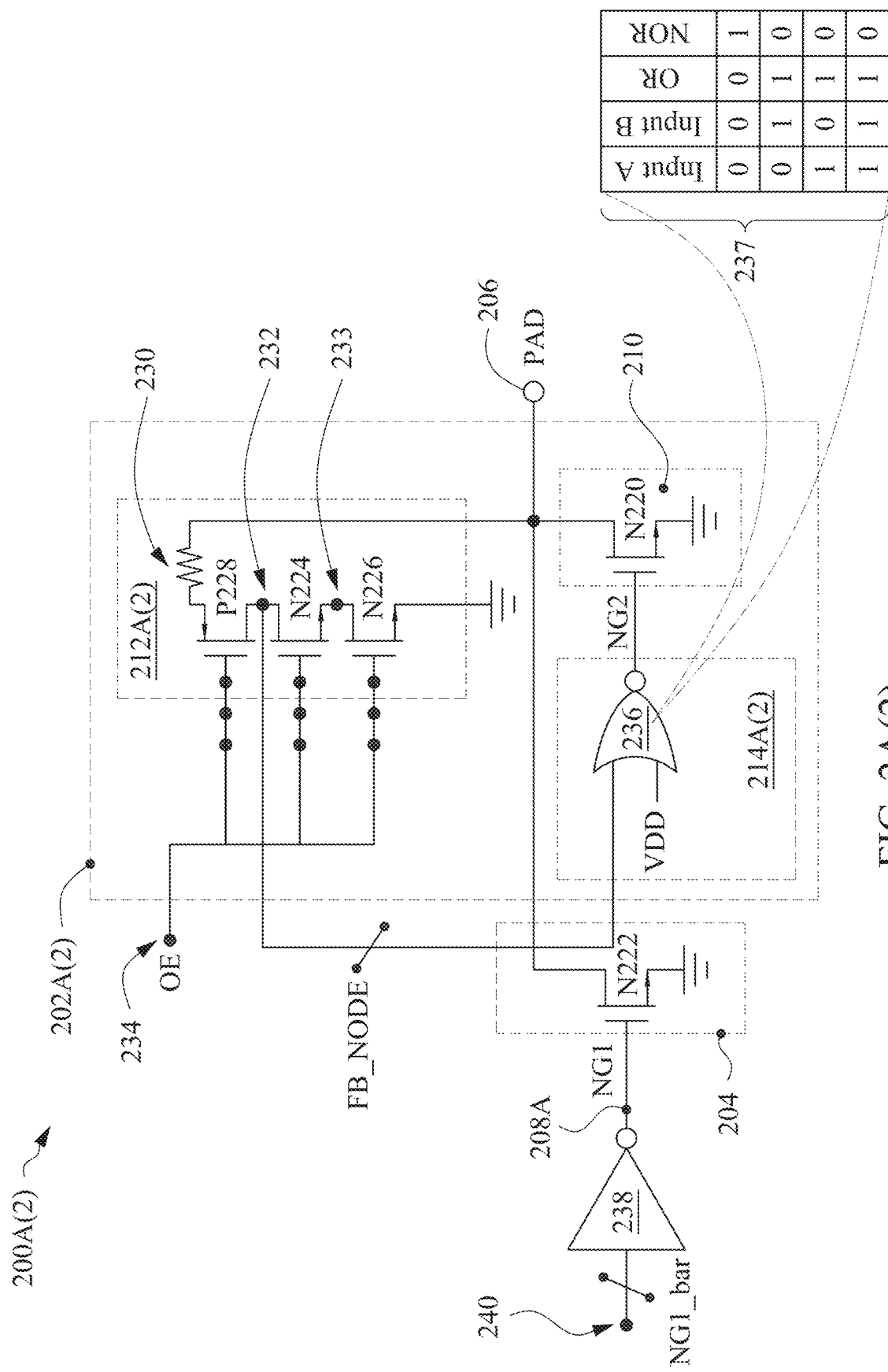
FIG. 2A(2)

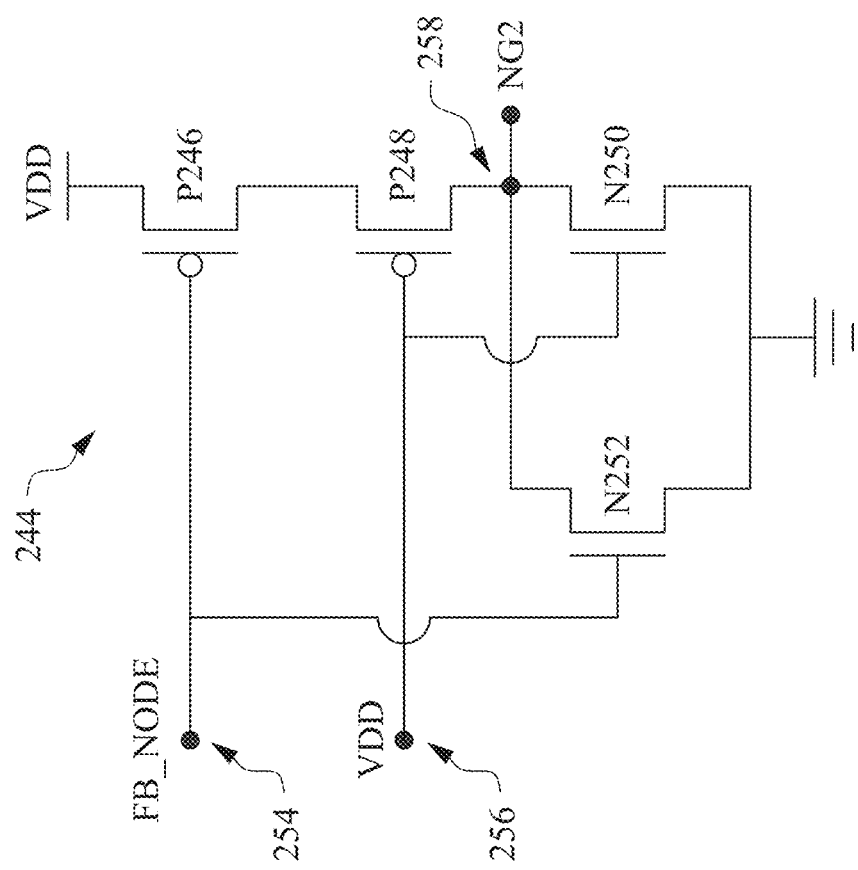
FIG. 2A(3)

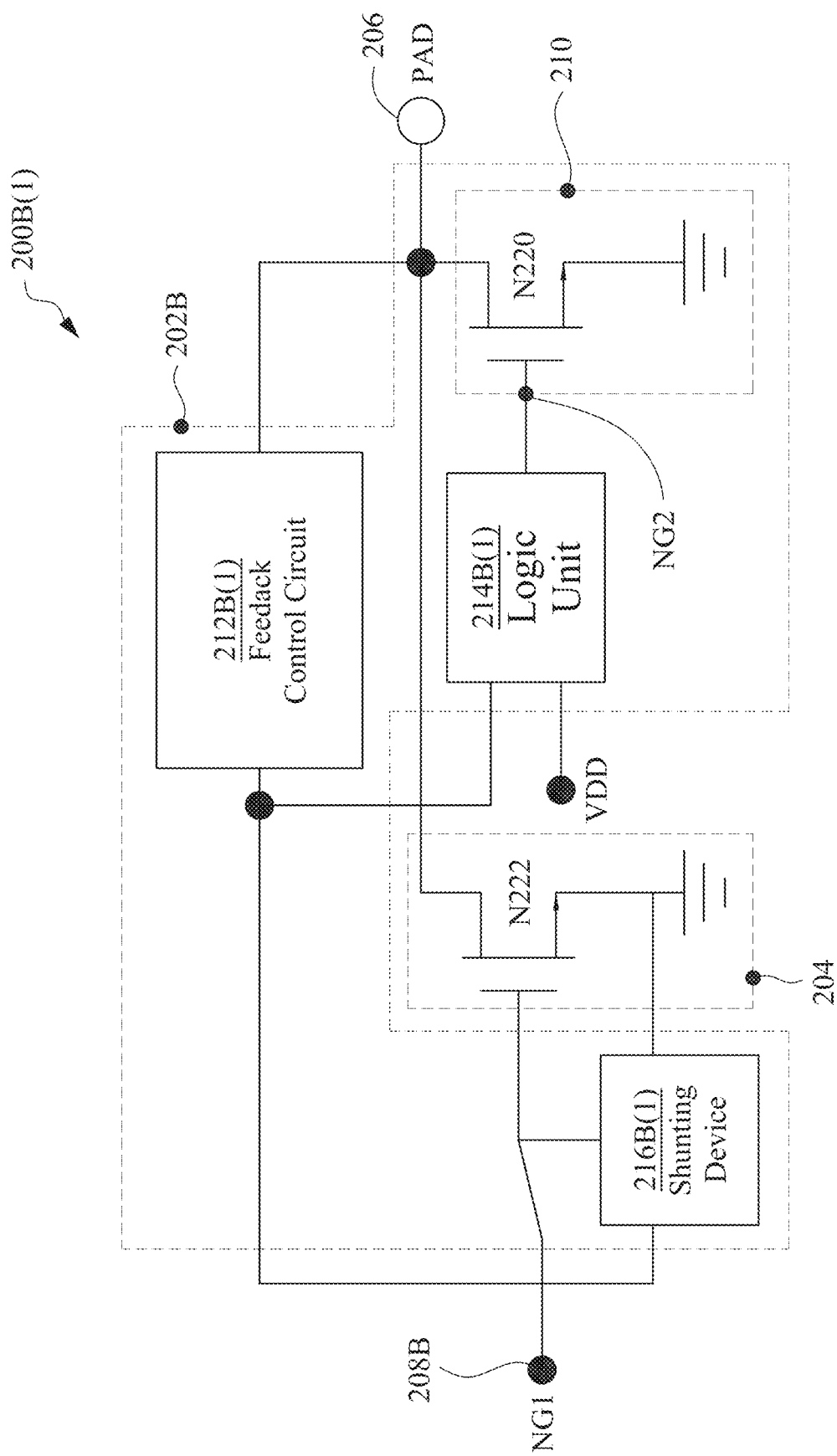
FIG. 2B(1)

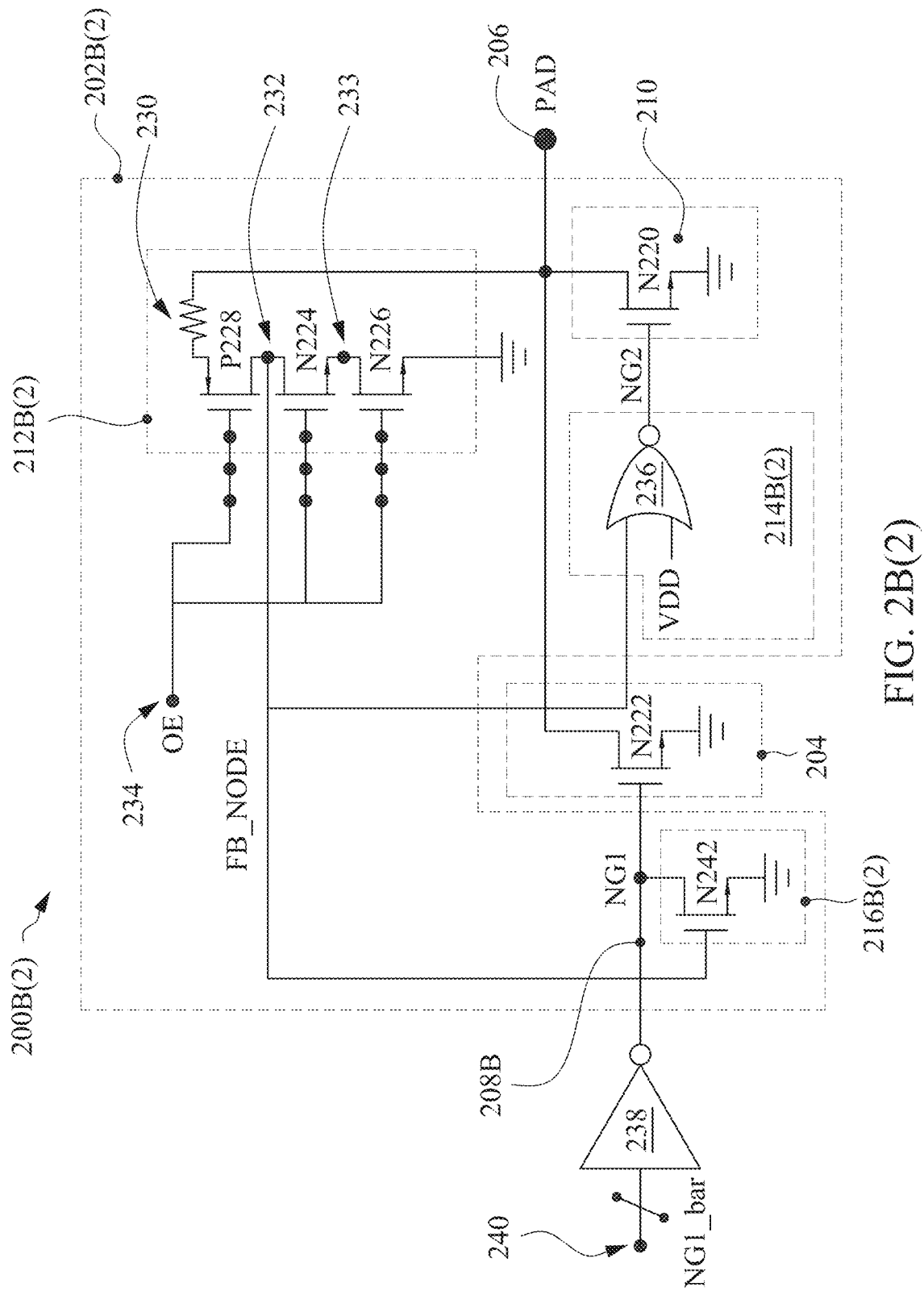
FIG. 2B(2)

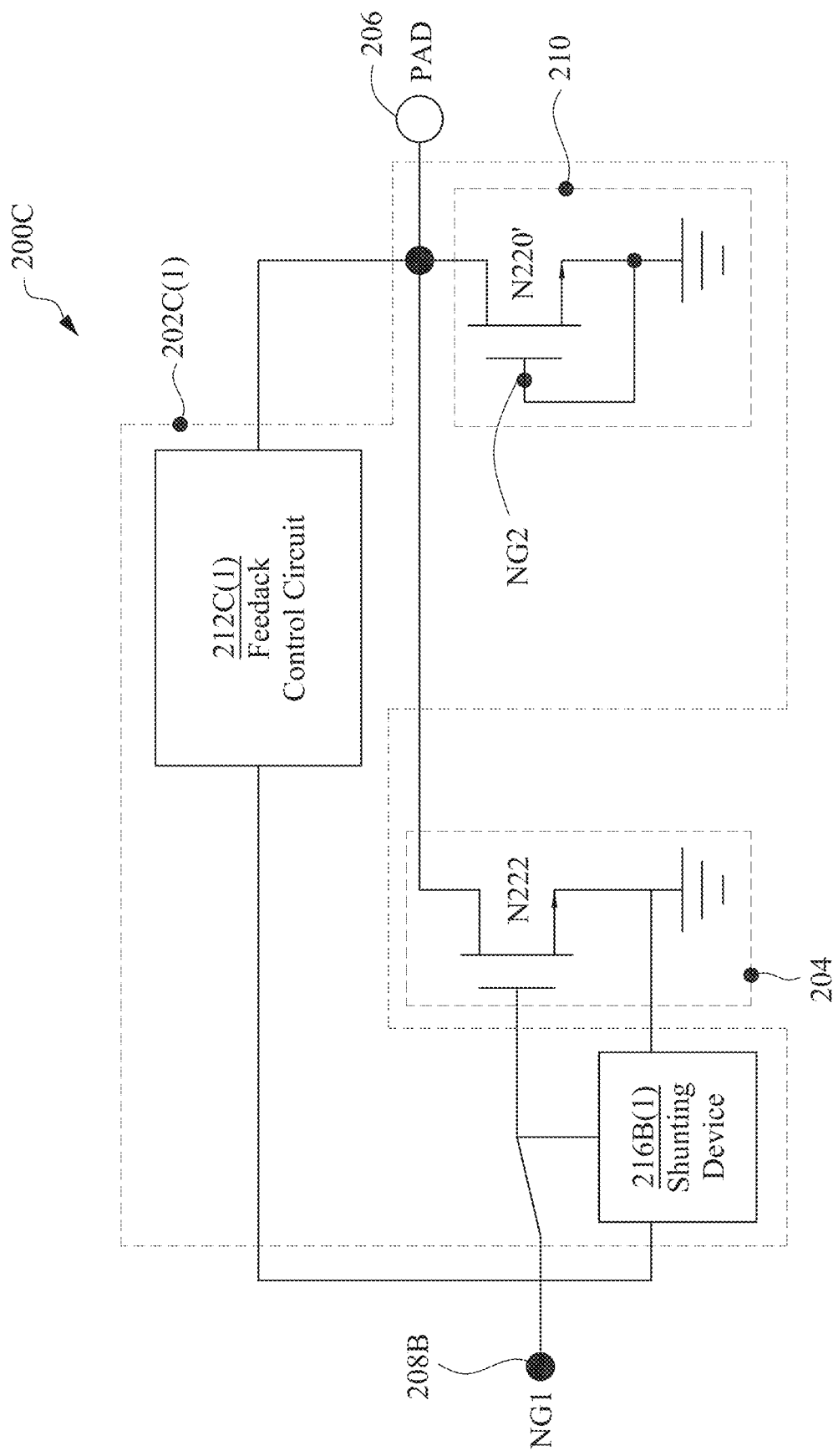
FIG. 2C(1)

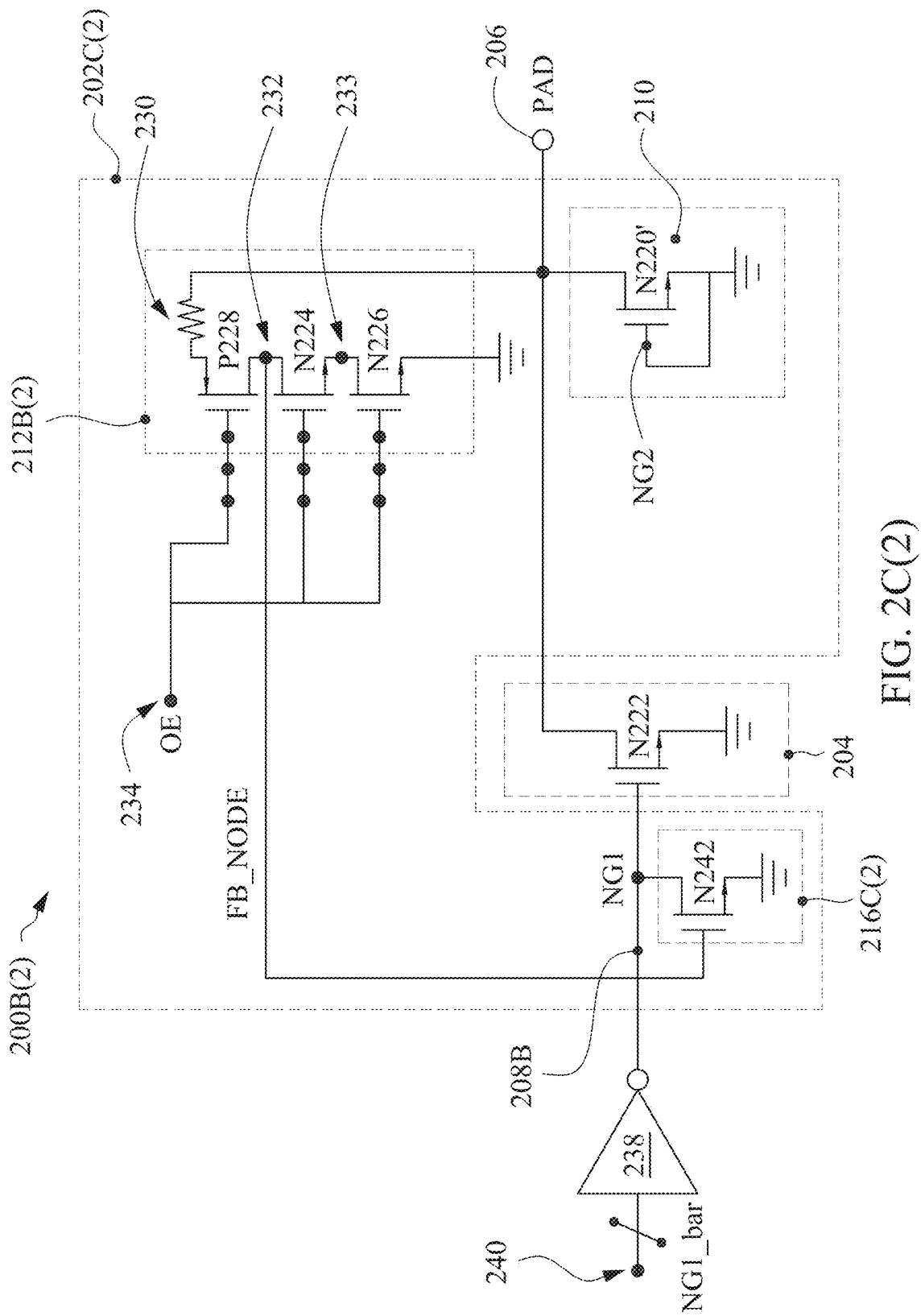
FIG. 2C(2)

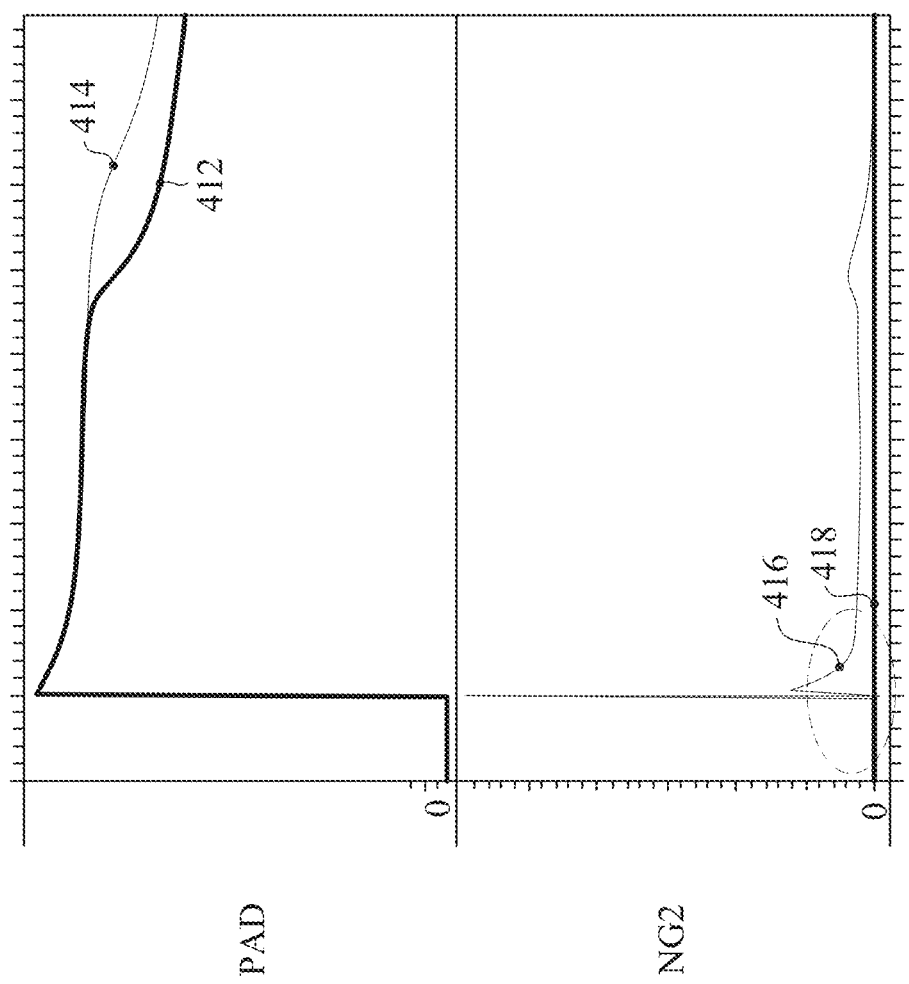

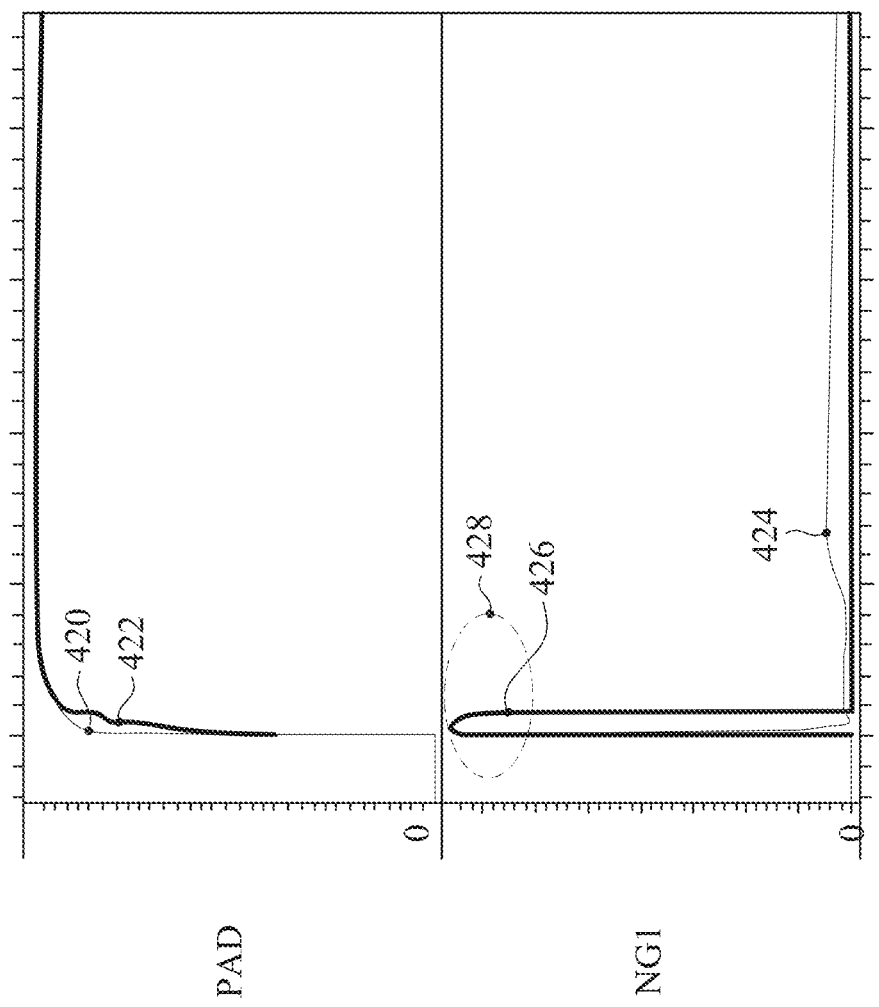

ESD PROTECTION CIRCUIT, SEMICONDUCTOR SYSTEM INCLUDING SAME, AND METHOD FOR OPERATING SAME

PRIORITY CLAIM AND CROSS-REFERENCE

The present application claims the priority of U.S. Provisional Application No. 62/725,706, filed Aug. 30, 2018, which is incorporated herein by reference in its entirety.

BACKGROUND

An electrostatic discharge (ESD) event, e.g., an ESD pulse or ESD spike, is a phenomenon where electrostatic charges migrate from a non-conductive surface via a conductive material. For example, an electrostatic voltage from hundreds to thousands of volts can be created on a human body walking on a carpet under a higher relative humidity, while more than 10,000 volts can be created under a lower relative humidity. Also, an electrostatic voltage from hundreds to thousands of volts can be created in machines for packaging or testing integrated circuits. Therefore, a semiconductor system is subjected to a large transient ESD current when a human body or a machine carrying electrostatic charges contacts the semiconductor system.

With the continued miniaturization of semiconductor systems, e.g., integrated circuit (IC) devices, the current trend is to produce integrated circuits having increasingly smaller components, e.g., shallower junction depths, thinner gate oxides, lightly-doped drain (LDD) structures, shallow trench isolation (STI) structures, self-aligned silicide (salicide) processes, or the like, all of which are used in advanced complementary metal oxide semiconductor (CMOS) technologies. The resultant semiconductor systems are increasingly more susceptible to damage due to ESD events. For example, gate dielectrics are particularly vulnerable to ESD damage. Therefore, ESD protection circuits are built onto the chip to protect the devices and circuits in the semiconductor system from ESD damage by conducting an ESD current to ground.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A(1) is a block diagram of a semiconductor system, in accordance with some embodiments.

FIG. 2A(2) is a circuit diagram of a semiconductor system, in accordance with some embodiments.

FIG. 2A(3) is a transistor-level circuit diagram, in accordance with some embodiments.

FIG. 2B(1) is a block diagram of a semiconductor system, in accordance with some embodiments.

FIG. 2B(2) is a circuit diagram of a semiconductor system, in accordance with some embodiments.

FIG. 2C(1) is a block diagram of a semiconductor system, in accordance with some embodiments.

FIG. 2C(2) is a circuit diagram of a semiconductor system, in accordance with some embodiments.

FIGS. 4A-4C are corresponding waveforms, some of which represent operation of ESD protection circuits in accordance with some embodiments.

DETAILED DESCRIPTION

Figure 1:
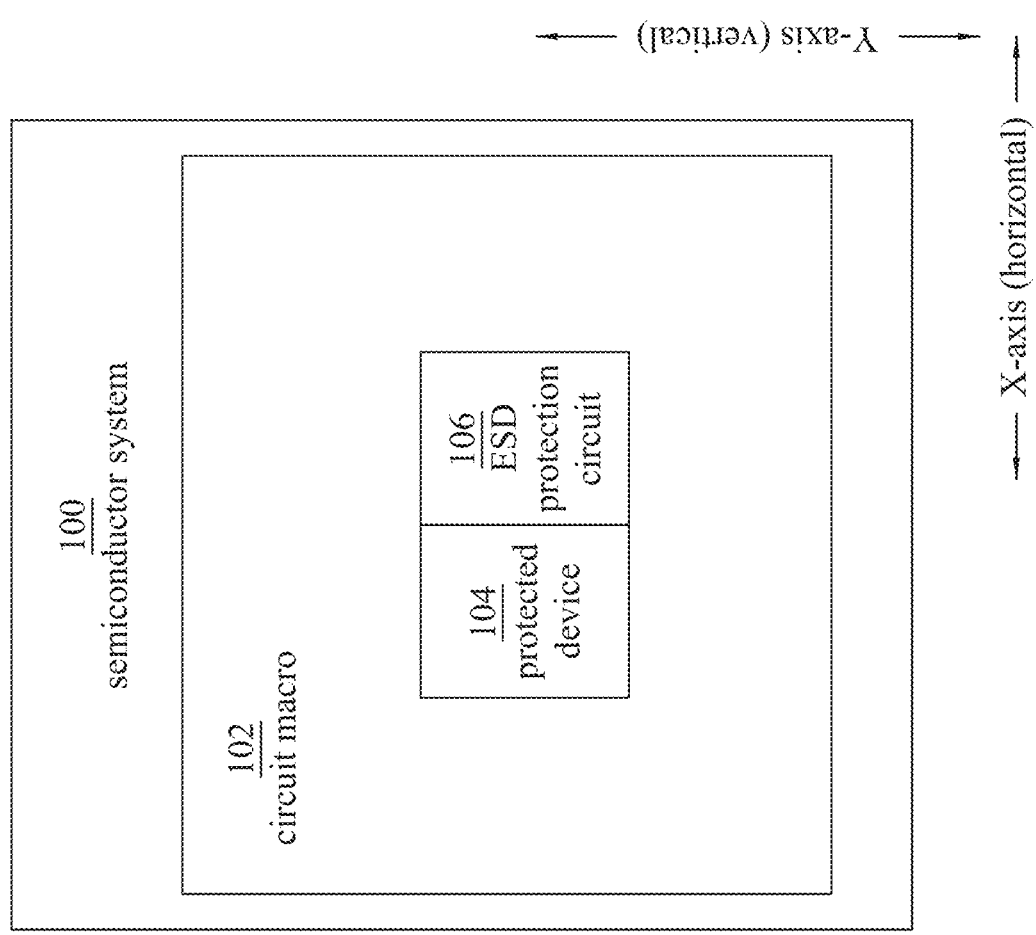
FIG. 1 is a block diagram of a semiconductor system, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Under normal operation of a semiconductor system, a typical ESD device is turned off so as to not affect operation of the corresponding semiconductor system, e.g., more particularly of a corresponding protected semiconductor device. When an ESD event (which is transient) occurs, the typical ESD device is intended to turn on so as to conduct (shunt) an ESD current to ground and thereby avoid having the ESD current pass through the protected semiconductor device. To better shunt the high voltage of an ESD discharge to ground, a typical ESD device is configured as an NMOS transistor having a single large channel, or smaller 'finger' channels which cumulatively represent a large channel. If the magnitude of an ESD event is sufficient, the shunting behavior of the NMOS transistor is modeled as an equivalent circuit represented as a parasitic NPN bipolar junction transistor (BJT) experiencing avalanche breakdown. In the parasitic NPN bipolar junction transistor (BJT) model, the drain (n-type) of the NMOS transistor acts as the collector (C) of the BJT, the source (n-type) of the NMOS transistor acts as the emitter (E) of the BJT, and the substrate (p-type) of the NMOS transistor acts as the base (B) of the BJT. In avalanche breakdown down, the current conduction capacity/capability of the NMOS transistor is about a factor of ten greater than during normal operation of the NMOS transistor.

According to another approach, a semiconductor system includes an ESD device coupled between an input/output terminal (pad) of the semiconductor system and ground. A gate terminal of the NMOS transistor of the other approach is coupled to ground either directly (in a grounded-gate NMOS configuration (GGNMOS) or indirectly with a resistor therebetween (in a grounded-gate NMOS with resistor configuration (GRNMOS) coupling the gate terminal of the NMOS transistor to ground, each of which represents a passive coupling to ground. There is a parasitic capacitance between the gate and drain terminals of the GGNMOS and the GRNMOS (which represents a parasitic GD capacitor). During normal operation of the semiconductor system, the pad is provided with a normal signal having a high frequency and a sharp rising time, e.g., a substantially square wave. The passive grounding of the gate electrode according to the other approach is insufficient to prevent the parasitic GD capacitor from charging to a value greater than the threshold voltage of the GRNMOS, which causes the GRNMOS to turn on briefly albeit long enough to substantially distort the normal signal on the pad.

In some embodiments, a semiconductor system includes an ESD device (e.g., an NMOS transistor) coupled between an input/output terminal (pad) of a semiconductor system and ground, and a logic unit (e.g., a NOR gate) coupled to a control input of the ESD device (e.g., the gate terminal of the NMOS transistor). Recalling the tendency of the normal signal on the pad to charge the parasitic GD capacitor of the NMOS transistor, in order to reduce (if not eliminate) a tendency for a normal signal otherwise to turn on the NMOS transistor, the logic unit of at least some embodiments actively couples the gate terminal of the NMOS transistor to ground, whereas the other approach passively couples the gate terminal to ground directly (GGNMOS) or via a resistor (GRNMOS). Such active grounding offsets the charging of the parasitic GD capacitor, which substantially reduces the length of time in which the NMOS transistor is turned on due to the parasitic GD capacitor having been charged to a value greater than the threshold voltage of the NMOS transistor. A benefit of the active grounding is a substantial reduction in the length of time during which the normal signal on the pad is distorted by the NMOS transistor having been turned on.

In some embodiments, in a semiconductor system which includes an ESD device (e.g., a first NMOS transistor) coupled between an input/output terminal (pad) of a semiconductor system and ground, and a protected device (e.g., a second NMOS transistor) coupled between the pad and a reference voltage (e.g., VS S), a shunting device (e.g., a third NMOS transistor) is provided between an input of the protected device (second NMOS transistor) and a reference voltage (e.g., VSS), and a feedback control circuit is provided between the pad and an input of the shunting device. In light of an ESD signal on the pad having a tendency to charge the parasitic GD capacitor of an NMOS transistor, in order to reduce (if not eliminate) a tendency for an ESD event to turn on the protected device (second NMOS transistor) and cause the same to shunt the ESD signal to ground, in some embodiments, the feedback control circuit uses the ESD signal to turn on the shunting device (third NMOS transistor), which then causes the shunting device (third NMOS transistor) to actively couple the protected device (gate terminal of second NMOS transistor) to ground. Such active grounding offsets the charging of the parasitic GD capacitor in the protected device (second NMOS transistor), which substantially reduces the length of time in which the protected device (second NMOS transistor) is turned on due to the parasitic GD capacitor having been charged to a value greater than the threshold voltage of the second NMOS transistor. A benefit of the active grounding is a substantial reduction in the length of time during which the ESD signal is shunted by the protected device (second NMOS transistor).

FIG. 1 is a block diagram of a semiconductor system 100 in accordance with at least one embodiment of the present disclosure.

In FIG. 1, semiconductor system 100 includes, among other things, a circuit macro (hereinafter, macro) 102. Macro 102 includes, among other things, a device to be protected (protected device) 104 and an ESD protection circuit 106. The circuit diagrams disclosed in the present application are corresponding examples of protected device 104 and ESD protection circuit 106.

FIG. 2A(1) is a block diagram of a semiconductor system 200A(1), in accordance with some embodiments.

Semiconductor system 200A(1) includes an ESD protection circuit 202A(1) and a protected device 204, which are corresponding examples of ESD protection circuit 106 and protected device 104 of FIG. 1.

ESD protection circuit 202A(1) includes an ESD device 210, a feedback control circuit 212A(1) and a logic unit 214A(1). ESD device includes an NMOS transistor N220. Protected device 204 includes an NMOS transistor N222. In some embodiments, protected device 204 represents a driver.

Logic unit 214A(1) is configured to actively couple the transistor N220 to ground (see FIG. 2A(2)). Feedback control circuit 212A(1) is configured to provide VSS or, if an ESD signal/voltage is present on node 206, the ESD signal/voltage on node 206 to an input of logic block 214A(2) (see FIG. 2A(2)).

Semiconductor system 200A(1) uses at least first and second reference voltages. In some embodiments, the first and second reference voltages correspondingly are VDD and VSS (ground). In some embodiments, the first and second reference voltages are corresponding voltages correspondingly other than VDD and VSS.

Feedback control circuit 212A(1) is coupled between node 206 and a first input of logic unit 214A(1). Logic unit 214A(1) is coupled between feedback control circuit 212 (1) and a gate terminal of transistor N220. In particular, a first input of logic unit 214A(1) is coupled to an output of feedback control circuit 212A(1). A second input of logic unit 214A(1) is coupled to a source of voltage which represents a logical value of one. An output of logic unit 214A(1) is coupled to the gate terminal of transistor N220. In FIG. 2A(1), VDD is used as the source of voltage which represents a logical value of one. In some embodiments, a voltage other than VDD is used as the source of voltage which represents a logical value of one.

Transistor N220 has a large capacity/capability to conduct (shunt) ESD current to ground. transistor N220 has a substantially larger channel arrangement than transistor N222. In some embodiments, transistor N220 has a substantially larger channel arrangement than is typical of a majority of other NMOS transistors in a system such as semiconductor system 200A(1). In some embodiments, transistor N220 has a single large channel. In some embodiments, transistor N220 has smaller 'finger' channels which cumulatively represent a large channel. In some embodiments, a width to length ratio (W/L) of transistor N220 is at least about 1000. In some embodiments, transistor N220 has large channel albeit of a different W/L ratio than about 1000.

In some embodiments, if the magnitude of an ESD event is sufficient, the shunting behavior of transistor N220 is modeled as an equivalent circuit represented as a parasitic NPN bipolar junction transistor (BJT) experiencing avalanche breakdown. In avalanche breakdown down, the current conduction capacity/capability of transistor N220 is substantially larger than during normal operation of NMOS transistor N220. In the parasitic NPN bipolar junction transistor (BJT) model, the drain (n-type) of the NMOS transistor acts as the collector (C) of the BJT, the source (n-type) of the NMOS transistor acts as the emitter (E) of the BJT, and the substrate (p-type) of the NMOS transistor acts as the base (B) of the BJT. Details regarding breakdown voltages, modeling transistor N220 as an NPN BJT during avalanche breakdown, or the like, are found in, e.g., U.S. Pat. No. 7,672,101, granted Mar. 2, 2010, U.S. Pat. No. 8,854,778, granted Oct. 7, 2014, and U.S. Pat. No. 7,518,192, granted Apr. 14, 2009, the entireties of each of which are hereby incorporated by reference.

In some embodiments, in avalanche breakdown down, the current conduction capacity/capability of transistor N220 is about a factor of ten greater than during normal operation of NMOS transistor N220. In some embodiments, in avalanche breakdown down, the current conduction capacity/capability of transistor N220 is large albeit different than about a factor of ten greater than during normal operation of NMOS transistor N220.

In FIG. 2A(1), each of transistors N220 and N222 is coupled between a node 206 and ground. In some embodiments, node 206 represents and an input/output (I/O) terminal of semiconductor system 200A(1). A signal named PAD is available on terminal 206. A node 208A is coupled to a gate terminal of transistor N222. A signal NG1 is available on node 208A.

FIG. 2A(2) is a circuit diagram of a semiconductor system 200A(2), in accordance with some embodiments.

Semiconductor system 200A(2) of FIG. 2A(2) corresponds to semiconductor system 200A(1) of FIG. 2A(1), however FIG. 2A(2) provides more detail than FIG. 2A(1). FIG. 2A(2) follows a similar numbering convention to that of FIG. 2A(1). Though corresponding, some components also differ. To help identify components which correspond but nevertheless have differences, the numbering convention uses parentheticals. For example, ESD protection circuit 202A(2) of FIG. 2A(2) corresponds to ESD protection circuit 202A(1) of FIG. 2A, with the similarities being reflected in the common root number 202A, and the differences being reflected in the corresponding parentheticals (1) and (2), namely 202A(1) for FIGS. 2A(1) and 202A(2) for FIG. 2A(2). For brevity, the discussion will focus more on differences between FIG. 2A(2) and FIG. 2A(1) than on similarities.

In FIG. 2A(2), logic unit 214A(2) includes a NOR gate 236. The truth table for NOR gate 236 is shown as table 237. The first and second inputs of logic unit 214A(2) correspond to first and second inputs of NOR gate 236. The output of logic unit 214A(2) corresponds to the output of NOR gate 236. In some embodiments, logic unit 214A(1) includes a logical gate or circuit other than NOR gate 236. In some embodiments, logic unit 214A(1) includes one or more logical gates or one or more circuits other than, or in addition to, NOR gate 236. In some embodiments, such logical gates or circuits other than NOR gate 236 include a NAND gate, an OR gate, an AND gate, a buffer, a decoupling capacitance (decap) circuit, or the like. In some embodiments, the decap circuit is a passive decap circuit. In some embodiments, the decap circuit is an unswitched decap circuit. In some embodiments, the decap circuit is an active circuit. In some embodiments, the decap circuit is a switched decap circuit.

Feedback control circuit includes an NMOS transistor N224, an NMOS transistor 226, a PMOS transistor P228 and a resistor 230. In some embodiments, resistor 230 is replaced with a PMOS transistor (not shown). A sequence of resistor 230, transistors P228, N224 and N226 is coupled in series between node 206 and ground. Resistor 230 is coupled between transistor P228 and a node 232. Transistor N224 is coupled between node 232 and a node 233. Transistor N226 is coupled between node 233 and ground. The gate terminals of transistors P228, N224 and N226 are coupled to a node 234. A signal OE is available on node 234. A signal FB_NODE is available on node 232.

Semiconductor system 200A(2) further includes an inverter 238 coupled between a node 240 and node 208A. A signal NG1_bar is available on node 240, which inverter 238 inverts so as to provide signal NG1 on node 208A.

FIG. 2A(3) is a transistor-level circuit diagram of a NOR gate 244, in accordance with at least one embodiment of the present disclosure.

NOR gate 244 is an example implementation of NOR gate 236 of FIG. 2A(2).

In FIG. 2A, nodes 254 and 256 represent first and second input terminals of NOR gate 244, and node 258 represents an output terminal of NOR gate 244. Signals FB_NODE and VDD are correspondingly provided on nodes 254 and 256. Signal NG2 is provided on node 258. The truth table for NOR gate 244 corresponds to truth table 237 of FIG. 2A(2).

NOR gate 244 includes PMOS transistors P246 and P248, and NMOS transistors N250 and N252. A sequence of transistors P246, P248 and N250 is coupled in series between a first reference voltage and a second reference voltage. In FIG. 2A, the first reference voltage is VDD and the second reference voltage is VSS. In some embodiments, the first and second reference voltages are correspondingly something other than VDD and VSS. Transistor N252 is coupled between node 258 and VSS. The drain terminals of transistors P248, N250 and N252 also are coupled to node 258. The gate terminals of transistors P246 and N252 are coupled to node 254. The gate terminals of transistors P248 and N250 are coupled to node 256.

Returning to FIG. 2A(2), when semiconductor system 200A(2) is powered on, the operation of feedback control circuit 212A(2) and NOR gate 236 will be discussed in the context of Table 1 (below).

TABLE 1

| Row# | OE (node 234) | PAD (node 206) | FB_NODE (node 232) | VDD | OR | NOR |
|---|---|---|---|---|---|---|
| 1 | 1 | 0 | 0 | 1 | 1 | 0 |
| 2 | 1 | 1 | =PAD voltage | 1 | 1 | 0 |
| 3 | 0 | 0 | =PAD voltage | 1 | 1 | 0 |
| 4 | 0 | 1 | =PAD voltage | 1 | 1 | 0 |

Signal OE is a logical control signal. In some embodiments, OE is an acronym for the term "output enable." In some embodiments, signal OE is generated by a controller (not shown) of semiconductor system 200A(2). Assuming that semiconductor system 200A(2) is in a normal powered-on state, signal OE has two states, namely logical high and logical low.

Row 1 of Table 1 (above) assumes a circumstance in which no ESD signal is present on node 206 and signal OE is in a logical high state, with results that include transistor P228 being turned off and transistors N224 and N226 being turned on. Accordingly, transistors N224 and N226 pull node 232 to ground, which sets signal FB_NODE (and the first input of NOR gate 236) to a logical low state. Recalling that the second input of NOR gate 236 is VDD, the resultant output of NOR gate 236 is logical low.

Recalling that the gate terminal of transistor N220 is coupled to the output of NOR gate 236 and that the output of NOR gate 236 corresponds to node 258 of FIG. 2A(3), when the input of NOR gate 236 is logical high, transistors N250 and N252 actively pull the gate terminal of transistor N220 to ground. During normal operation of semiconductor system 200A(2), node 206 is provided with a normal PAD signal, which in some circumstances has a high frequency and a sharp rising time, e.g., a substantially square wave. For circumstances in which the normal PAD signal on node 206 has a high frequency and a sharp rising time, there is a tendency for the normal PAD signal on node 206 to charge a parasitic GD capacitor (not shown) of transistor N220. Charging the parasitic GD capacitor to a value greater than the threshold voltage of transistor N220 will turn on transistor N220. In order to reduce (if not eliminate) the tendency for the normal signal otherwise to turn on transistor N220, actively pulling the gate terminal of transistor N220 to ground by NOR gate 236 is performed in order to offset the charging of the parasitic GD capacitor. As such, actively pulling the gate terminal of transistor N220 to ground substantially reduces the length of time in which transistor N220 is turned on due to the parasitic GD capacitor having been charged to a value greater than the threshold voltage of transistor N220 (see FIGS. 4A-4B). A benefit of the active grounding is a substantial reduction in the length of time during which the normal signal on node 206 is distorted by transistor N220 having been turned on.

Row 3 of Table 1 (above) assumes a circumstance in which no ESD signal is present on node 206 and signal OE is in a logical low state, with results that include transistor P228 being turned on and transistors N224 and N226 being turned off. Accordingly, transistor P228 pulls node 232 towards a voltage on node 206 albeit reduced by the voltage drop across resistor 230, which sets signal FB_NODE (and the first input of NOR gate 236) to the voltage on node 232. Recalling that the second input of NOR gate 236 is VDD, the resultant output of NOR gate 236 is logical low. Accordingly, NOR gate 236 actively pulls the gate terminal of transistor N220 to ground.

Row 2 of Table 1 (above) assumes a circumstance in which an ESD signal IS present briefly on node 206 and signal OE is in a logical high state, with results that include transistor P228 being turned off and transistors N224 and N226 being turned on. Accordingly, transistors N224 and N226 attempt to pull node 232 to ground. Depending on the magnitude of the ESD signal, the ESD signal may be sufficient to forward bias transistor P228 into conduction, overcoming the pull-down effect of transistors N224 and N226 and thereby pulling node 232 towards the ESD voltage on node 206 albeit reduced by the voltage drop across resistor 230, which sets signal FB_NODE (and the first input of NOR gate 236) to the ESD voltage on node 232. Recalling that the second input of NOR gate 236 is VDD, the resultant output of NOR gate 236 is logical low. Accordingly, NOR gate 236 actively pulls the gate terminal of transistor N220 to ground.

Row 4 of Table 1 (above) assumes a circumstance in which an ESD signal IS present briefly on node 206 and signal OE is in a logical low state, with results that include transistor P228 being turned on and transistors N224 and N226 being turned off. Accordingly, transistor P228 pulls node 232 towards the ESD voltage on node 206 albeit reduced by the voltage drop across resistor 230, which sets signal FB_NODE to the ESD voltage on node 232. Recalling that the second input of NOR gate 236 is VDD, the resultant output of NOR gate 236 is logical low (see Row 4 of Table 1, below). Accordingly, NOR gate 236 actively pulls the gate terminal of transistor N220 to ground.

When semiconductor system 200A(2) is powered off, the operation of feedback control circuit 212A(2) and NOR gate 236 will be discussed in the context of Table 2 (below).

TABLE 2

| Row# | OE (node 234) | PAD (node 206) | FB_NODE (node 232) | VDD | OR | NOR |
|---|---|---|---|---|---|---|
| 1 | 0 | 0 | 0 | 0 | n/a | n/a |
| 2 | 0 | 1 | 1 | 0 | n/a | n/a |

Recalling that the second input of NOR gate 236 is VDD, when semiconductor system 200A(2) is powered off, VDD is logical zero. Regardless, however, NOR gate 236 is powered off, and so does not provide a logical NOR function at the gate terminal of transistor N220, which is shown by the term "n/a" in Rows 1-2 of Table 2.

FIG. 2B(1) is a block diagram of a semiconductor system 200B(1), in accordance with some embodiments.

Semiconductor system 200B(1) includes an ESD protection circuit 202B(1) and a protected device 204, which are corresponding examples of ESD protection circuit 106 and protected device 104 of FIG. 1.

Semiconductor system 200B(1) of FIG. 2B(1) corresponds to semiconductor system 200A(1) of FIG. 2A(1), however semiconductor system 200B(1) of FIG. 2B(1) further includes a shunting device 216B(1). FIG. 2B(1) follows a similar numbering convention to that of FIG. 2A(1). Though corresponding, some components also differ. To help identify components which correspond but nevertheless have differences, the numbering convention uses suffixes. For example, ESD protection circuit 202B(1) of FIG. 2B(1) corresponds to ESD protection circuit 202A(1) of FIG. 2A, with the similarities being reflected in the common root number 202, and the differences being reflected in the corresponding suffixes A and B, namely 202A(1) for FIGS. 2A(1) and 202B(1) for FIG. 2B(1). For brevity, the discussion will focus more on differences between FIG. 2B(1) and FIG. 2A(1) than on similarities.

Shunting device 216B(1) of FIG. 2B(1) is coupled between feedback control circuit 212B(1) and a gate terminal of transistor N222. An input of shunting device 216B(1) is coupled to an output of feedback control circuit 212B(1).

FIG. 2B(2) is a circuit diagram of a semiconductor system 200B(2), in accordance with some embodiments.

Semiconductor system 200B(2) of FIG. 2B(2) corresponds to semiconductor system 200B(1) of FIG. 2B(1), however FIG. 2B(2) provides more detail than FIG. 2B(1). FIG. 2B(2) follows a similar numbering convention to that of FIG. 2B(1). Though corresponding, some components also differ. To help identify components which correspond but nevertheless have differences, the numbering convention uses parentheticals. For example, ESD protection circuit 202B(2) of FIG. 2B(2) corresponds to ESD protection circuit 202B(1) of FIG. 2B(1), with the similarities being reflected in the common root number 202B, and the differences being reflected in the corresponding parentheticals (1) and (2), namely 202B(1) for FIGS. 2B(1) and 202B(2) for FIG. 2B(2). For brevity, the discussion will focus more on differences between FIG. 2B(2) and FIG. 2B(1) than on similarities.

Semiconductor system 200B(2) includes inverter 238 coupled between node 240 and node 208B. A signal NG1_bar is available on node 240, which inverter 238 inverts so as to provide signal NG1 on node 208B.

Shunting device 216B(2) includes an NMOS transistor N242, which is coupled between the gate terminal of transistor N222 and ground. The gate terminal of transistor N242 is coupled to node 232. Under the control of signal FB_NODE, transistor N242 actively pulls the gate of transistor N222 to ground.

It is to be recalled that the transistor N222 is coupled between node 206 and ground. During an ESD event, the signal PAD on node 206 has the ESD signal. Typically, an ESD signal has a high voltage and a sharp rising time. For circumstances in which the PAD signal on node 206 has the ESD signal, there is a tendency for the ESD-boosted PAD signal on node 206 to charge a parasitic GD capacitor (not shown) of transistor N222. Charging the parasitic GD capacitor to a value greater than the threshold voltage of transistor N222 will turn on transistor N222. In order to reduce (if not eliminate) the tendency for the ESD-boosted PAD signal otherwise to turn on transistor N222, actively pulling the gate terminal of transistor N220 to ground by transistor N242 is performed in order to offset the charging of the parasitic GD capacitor. As such, actively pulling the gate terminal of transistor N222 to ground substantially reduces the length of time in which transistor N222 is turned on due to the parasitic GD capacitor having been charged to a value greater than the threshold voltage of transistor N222 (see FIG. 4C).

FIG. 2C(1) is a block diagram of a semiconductor system 200C(1), in accordance with some embodiments.

Semiconductor system 200C(1) includes an ESD protection circuit 202C(1) and a protected device 204, which are corresponding examples of ESD protection circuit 106 and protected device 104 of FIG. 1.

Semiconductor system 200C(1) of FIG. 2C(1) corresponds to semiconductor system 200B(1) of FIG. 2B(1), however semiconductor system 200C(1) of FIG. 2C(1) includes fewer components than semiconductor system 200B(1). FIG. 2C(1) follows a similar numbering convention to that of FIG. 2B(1). Though corresponding, some components also differ. To help identify components which correspond but nevertheless have differences, the numbering convention uses suffixes. For example, ESD protection circuit 202C(1) of FIG. 2C(1) corresponds to ESD protection circuit 202B(1) of FIG. 2B(1), with the similarities being reflected in the common root number 202, and the differences being reflected in the corresponding suffixes C and B, namely 202C(1) for FIGS. 2C(1) and 202B(1) for FIG. 2B(1).

For brevity, the discussion will focus more on differences between FIG. 2C(1) and FIG. 2B(1) than on similarities. For example, ESD protection circuit 202C(1) of FIG. 2C(1) does not include logic unit 214B(1) of ESD protection circuit 202B(1) of FIG. 2B(1). Transistor N220' is a grounded-gate NMOS (GGNMOS).

Details regarding GGNMOS, GRNMOS, a resistor-capacitor variant of GRNMOS (GCRNMOS), or the like, are found in, e.g., U.S. Pat. No. 6,388,850, granted May 14, 2002, and U.S. Pat. No. 7,420,793, granted Sep. 2, 2008, the entireties of each of which are hereby incorporated by reference.

FIG. 2C(2) is a circuit diagram of a semiconductor system 200C(2), in accordance with some embodiments.

Semiconductor system 200C(2) of FIG. 2C(2) corresponds to semiconductor system 200C(1) of FIG. 2C(1), however FIG. 2B(2) provides more detail than FIG. 2C(1). FIG. 2C(2) follows a similar numbering convention to that of FIG. 2C(1). Though corresponding, some components also differ. To help identify components which correspond but nevertheless have differences, the numbering convention uses parentheticals. For example, ESD protection circuit 202C(2) of FIG. 2C(2) corresponds to ESD protection circuit 202C(1) of FIG. 2C(1), with the similarities being reflected in the common root number 202C, and the differences being reflected in the corresponding parentheticals (1) and (2), namely 202C(1) for FIGS. 2C(1) and 202C(2) for FIG. 2C(2). For brevity, the discussion will focus more on differences between FIG. 2B(2) and FIG. 2B(1) than on similarities.

Semiconductor system 200C(2) of FIG. 2C(2) also corresponds to semiconductor system 200B(2) of FIG. 2B(2), however semiconductor system 200C(2) of FIG. 2C(2) includes fewer components than semiconductor system 200B(2). FIG. 2C(2) follows a similar numbering convention to that of FIG. 2C(1). Though corresponding, some components also differ. To help identify components which correspond but nevertheless have differences, the numbering convention uses suffixes. For example, ESD protection circuit 202C(1) of FIG. 2C(1) corresponds to ESD protection circuit 202C(2) of FIG. 2C(2), with the similarities being reflected in the common root number 202C, and the differences being reflected in the corresponding parentheticals (1) and (2), namely 202C(1) for FIGS. 2C(1) and 202C(2) for FIG. 2C(2).

For brevity, the discussion will focus more on differences between FIG. 2C(2) and FIG. 2C(1) than on similarities. To the extent that FIG. 2A(2) corresponds to FIG. 2B(2), the differences between FIG. 2C(2) and FIG. 2C(1) correspond to the differences between FIG. 2B(2) and FIG. 2B(1).

Figure 3A:
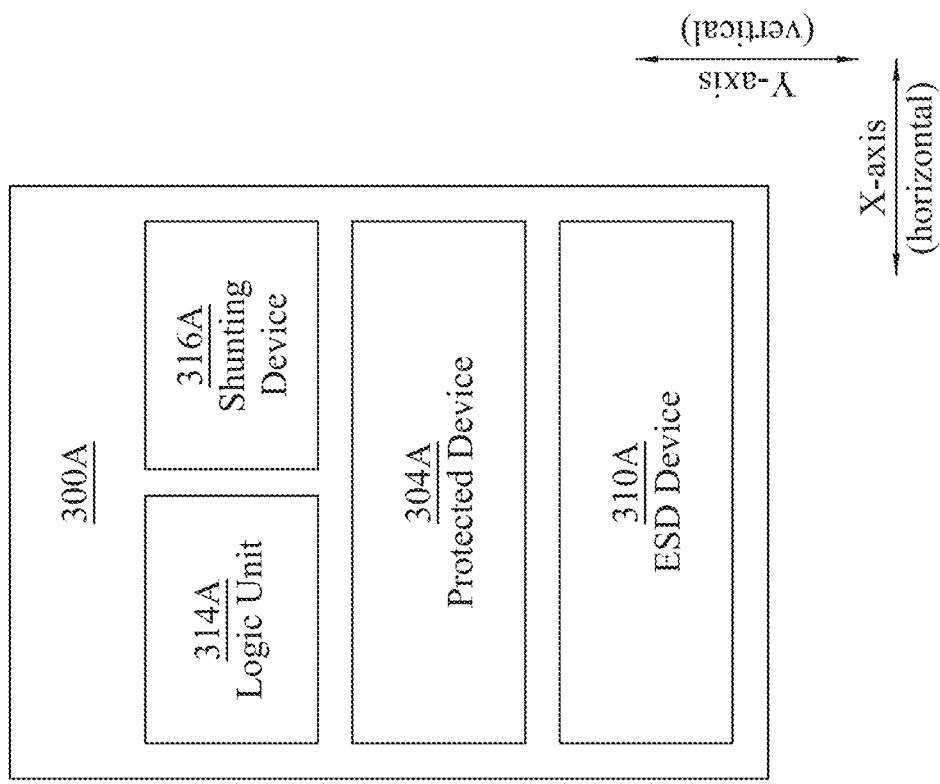
FIGS. 3A-3C are corresponding floor plan diagrams of corresponding semiconductor systems, in accordance with some embodiments.
Figure 3B:
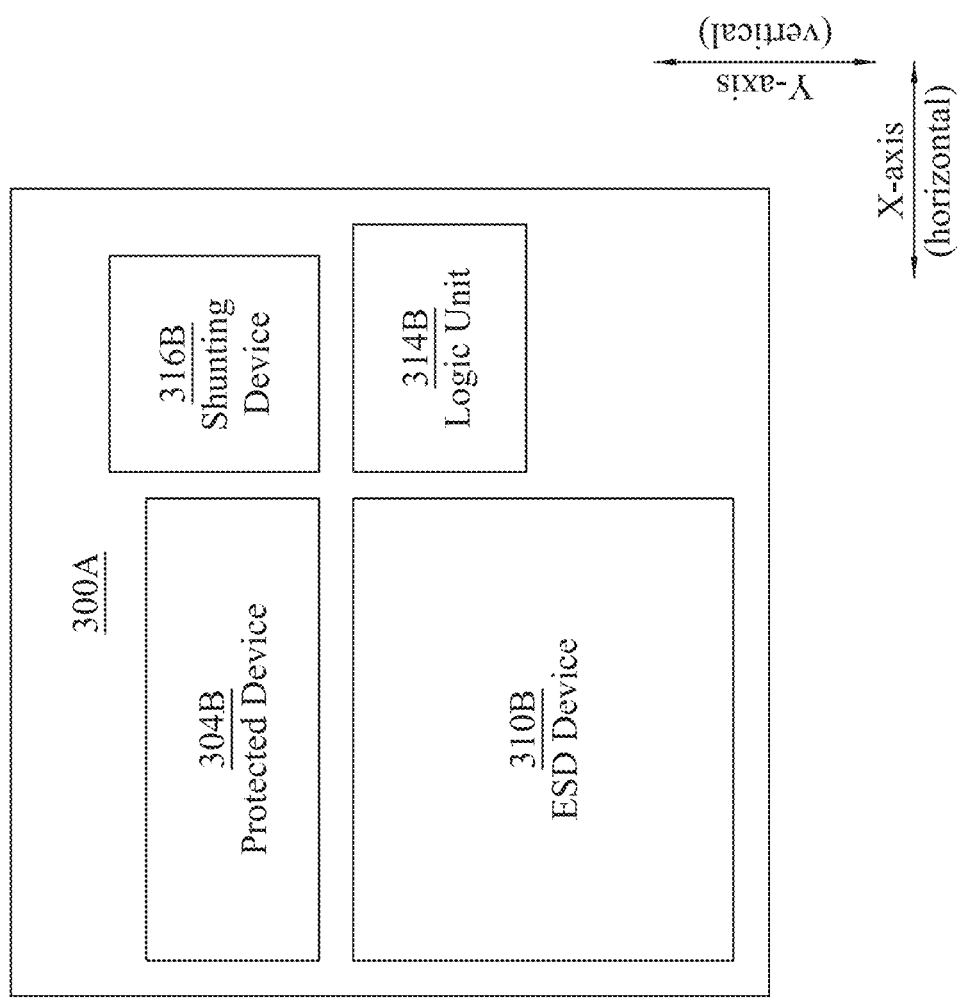
Figure 3C:
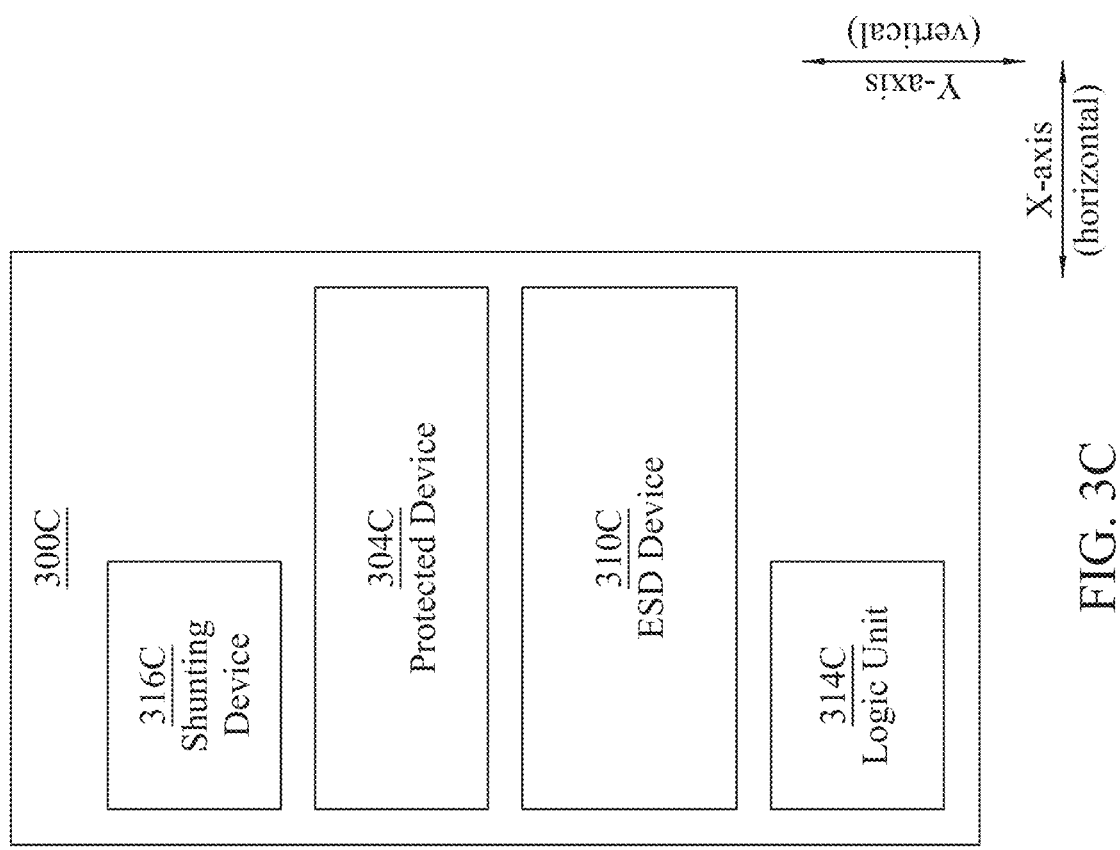

FIGS. 3A-3C are corresponding floor plan diagrams of corresponding semiconductor systems 300A, 300B and 300C, in accordance with some embodiments.

Each of FIGS. 3A-3C assumes a two-dimensional coordinate X-Y axis (horizontal and vertical). In some embodiments, the two-dimensional coordinate is something other than the X-Y axis.

In FIGS. 3A-3C, corresponding protected devices 304A, 304B and 304C are stacked over corresponding ESD devices 310A, 310B and 310C, relative to the vertical direction.

In FIG. 3A, logical unit 314A and shunting device 316A are stacked over protected device 304A, relative to the vertical direction. Also, logical unit 314A and shunting device 316A have approximately the same location relative to the vertical direction.

In FIG. 3B, shunting device 316B is stacked over logical unit 314B, relative to the vertical direction. shunting device 316B are disposed to the right sides of correspondingly of protected device 304B and ESD device 310B. Shunting device 316B has a location which is approximately the same as protected device 304B, relative to the vertical direction.

Logical unit 314B has approximately the same location as an upper portion of ESD device 310B, relative to the vertical direction.

In FIG. 3C, shunting device 316C is stacked over protected device 304C, relative to the vertical direction. Logical unit 314C is stacked under ESD device 310C, relative to the vertical direction.

Figure 4A:
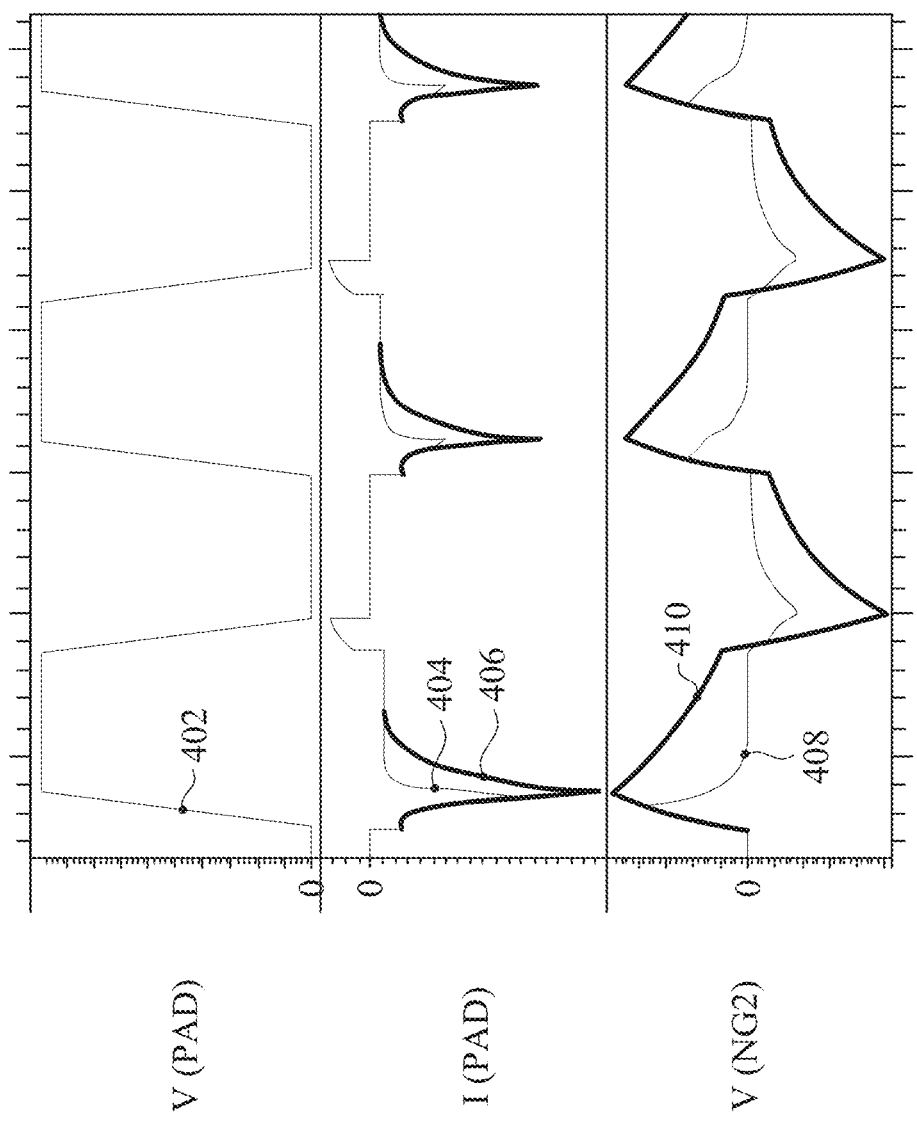

FIGS. 4A-4C are corresponding waveforms, some of which represent operation of ESD protection circuits in accordance with some embodiments.

FIG. 4A includes waveforms 402, 404, 406, 408 and 410. Waveform 402 represents a normal PAD signal in a circumstance in which the normal PAD signal is a substantially square wave having a high frequency and a sharp rising time. Waveform 404 represents current of the PAD signal (i(PAD)) for semiconductor system 200A(1) of FIG. 2A(1). Waveform 404 represents i(PAD) for the semiconductor system according to the other approach. Waveform 404 shows benefits including smaller magnitude and shorter duration as compared to waveform 406. Transient leakage current due to toggling of the normal PAD signal exhibits ≈53% reduction (~50% reduction) in waveform 404 as compared to waveform 406.

Waveform 408 represents a parasitic voltage (V(NG2)) on the gate terminal of transistor N220 of semiconductor system 200A(1) of FIG. 2A(1). Waveform 410 represents V(NG2) on a comparable NMOS transistor in the semiconductor system according to the other approach. Waveform 408 shows benefits including smaller magnitude and shorter duration as compared to waveform 410.

FIG. 4B includes waveforms 412, 414, 416 and 418. Waveform 412 represents a PAD signal which includes an ESD signal in the context of semiconductor system 200A(1) of FIG. 2A(1). Waveform 404 represents a PAD signal which includes an ESD signal in the context of the semiconductor system according to the other approach. Waveform 412 shows benefits including reducing in magnitude sooner than waveform 414.

Waveform 416 represents a voltage of signal NG2 on the gate terminal of transistor N220 of semiconductor system 200A(1) of FIG. 2A(1). Waveform 418 represents the voltage of signal NG2 on a comparable NMOS transistor configured as a GGNMOS in the semiconductor system according to the other approach. Waveform 416 shows benefits including a more active discharge to ground.

FIG. 4C includes waveforms 420, 422, 424 and 426. Waveform 420 represents a PAD signal which includes an ESD signal in the context of semiconductor system 200C(1) of FIG. 2C. Waveform 422 represents a PAD signal which includes an ESD signal in the context of the semiconductor system according to the other approach.

Waveform 424 represents a voltage of signal NG1 on the gate terminal of transistor N222 of semiconductor system 200C(1) of FIG. 2C(1). Waveform 426 represents the voltage of signal NG2 of a comparable NMOS transistor of the semiconductor system according to the other approach. Waveform 424 shows benefits including shorter duration than waveform 426, which means that transistor N222 of FIG. 2C(1) is turned off more quickly than the comparable NMOS transistor of the semiconductor system according to the other approach.

Figure 5:
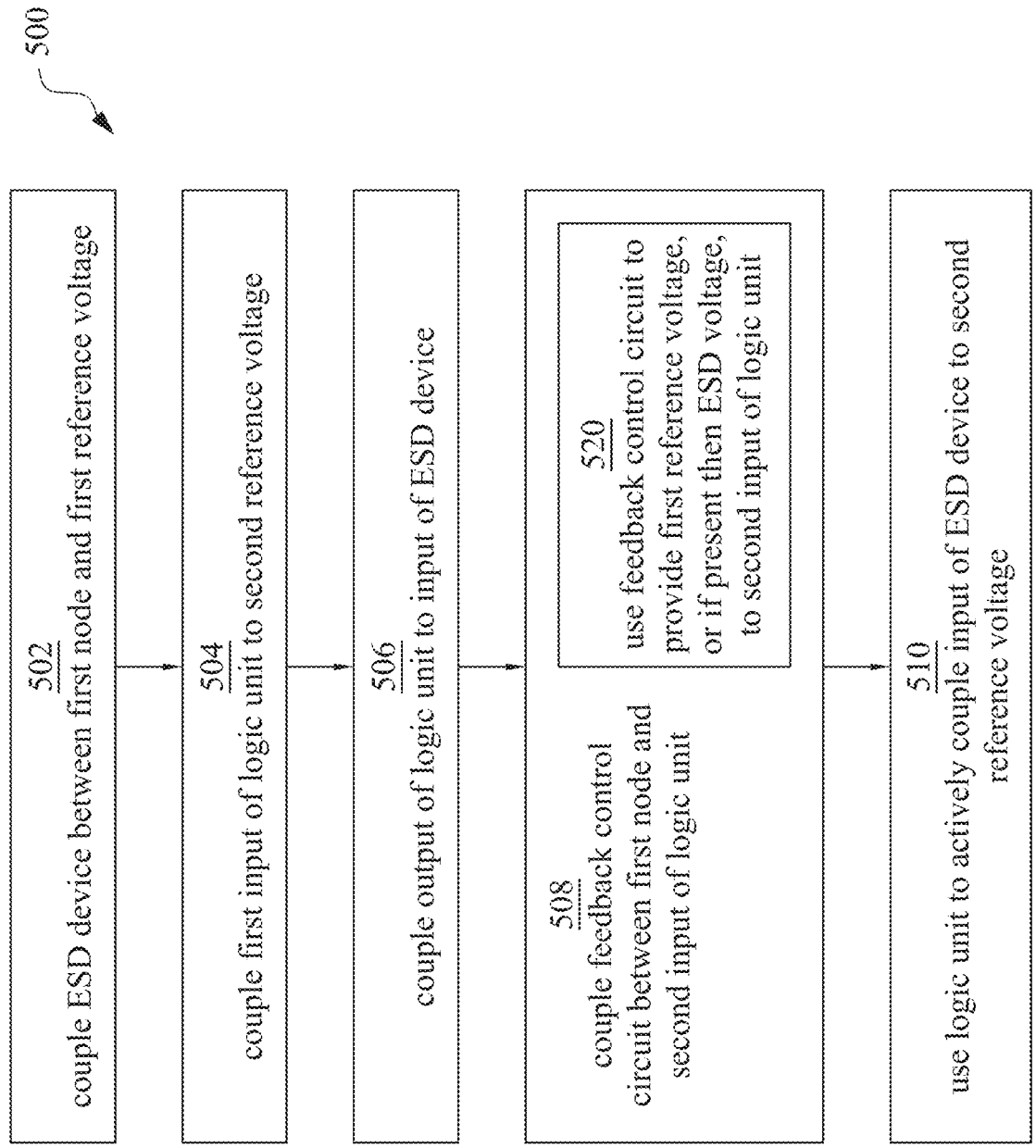
FIG. 5 is a flowchart of operating an ESD protection circuit, in accordance with some embodiments.

FIG. 5 is a flowchart of operating an ESD protection circuit, in accordance with some embodiments. More particularly, FIG. 5 is a flowchart of a method 500 of protecting a device (protected device), in accordance with one or more embodiments.

In FIG. 5, method 500 includes blocks 502-510 and 520. An example of the protected device is transistor N222 of FIG. 2A(2). At block 502, an ESD device is coupled between a first node and a first reference voltage. An example of the first node is node 205 in FIG. 2A(2). An example of the ESD device is transistor N220 of FIG. 2A(2). An example of the first reference voltage is VSS in FIG. 2A(2). From block 502, flow proceeds to block 504.

At block 504, a first input of a logic unit is coupled to a second reference voltage. An example of the logic unit is NOR gate 236 of FIG. 2A(2). An example of the second reference voltage is VDD in FIG. 2A(2). From block 504, flow proceeds to block 506.

At block 506, an output of the logic unit is coupled to an input of the ESD device. An example of such coupling is coupling the output of NOR gate 236 to the gate terminal of transistor N220 in FIG. 2A(2). From block 506, flow proceeds to block 508.

At block 508, a feedback control circuit is coupled between the first node and a second input of the logic unit. An example of the feedback control circuit is feedback control circuit 212A(2) of FIG. 2A(2), which is coupled between node 206 and one of the inputs of NOR gate 236 in FIG. 2A(2).

In some embodiments, block 508 includes block 520. At block 520, the feedback control circuit is used to provide the first reference voltage, or if present then the ESD voltage on the first node, to the second input of the logic unit. An example of this is the electrical path in FIG. 2A(2) which includes node 206, resistor 230, transistor P228, node 232 and one of the inputs of NOR gate 236. From block 520, flow exits block 508. From block 508, flow proceeds to block 510.

At block 510, the logic unit is used to actively couple the input of the ESD device to the second reference voltage. An example of such active coupling is NOR gate 236 actively pulling the gate terminal of transistor N220 to ground in FIG. 2A(2).

Figure 6:
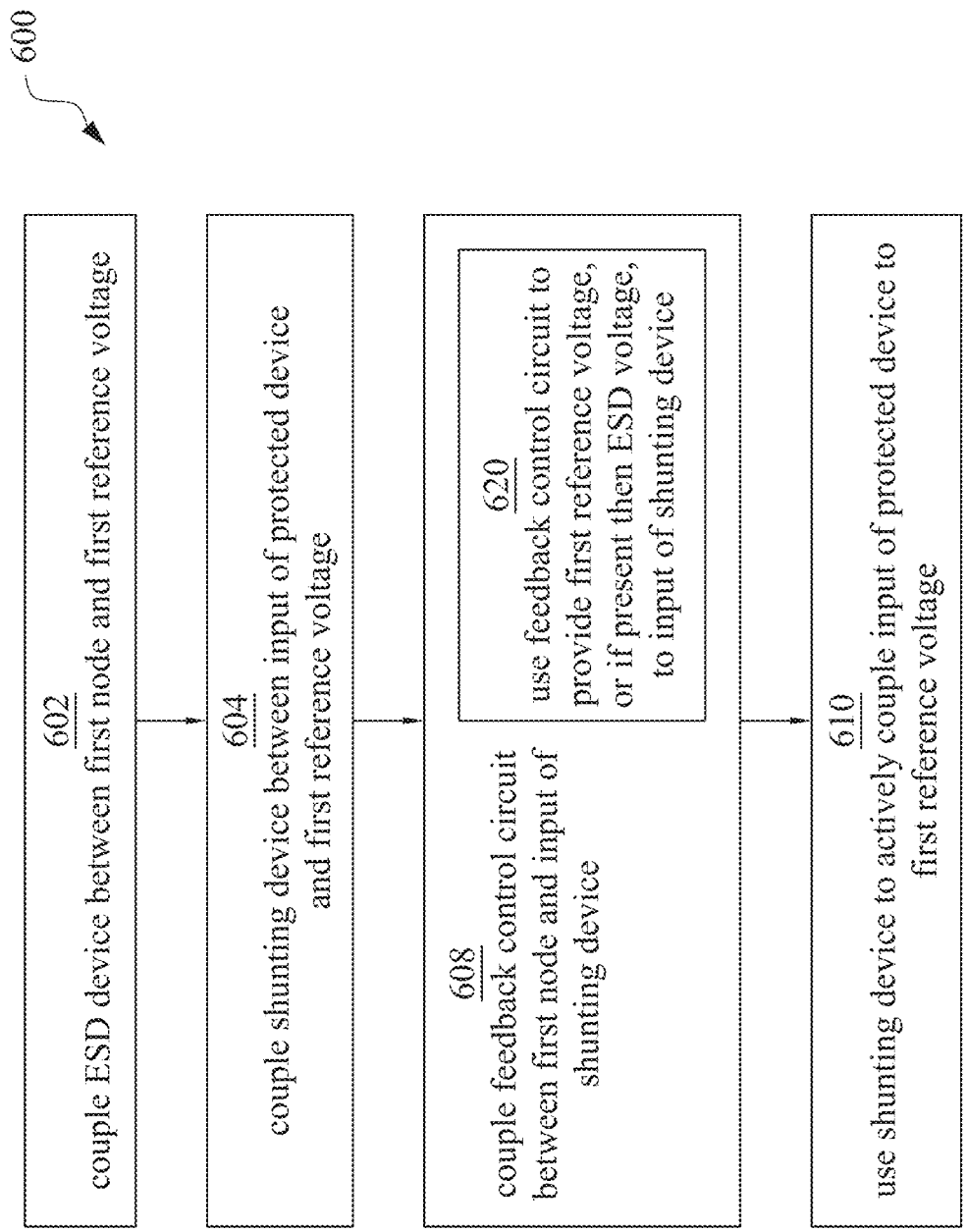
FIG. 6 is a flowchart of operating an ESD protection circuit, in accordance with some embodiments.

FIG. 6 is a flowchart of operating an ESD protection circuit, in accordance with some embodiments. More particularly, FIG. 6 is a flowchart of a method 600 of protecting a device (protected device), in accordance with one or more embodiments.

In FIG. 6, method 600 includes blocks 602-604, 608 and 520. An example of the protected device is transistor N222 of FIG. 2C(2). At block 602, an ESD device is coupled between a first node and a first reference voltage. An example of the first node is node 205 in FIG. 2A(2). An example of the ESD device is transistor N220 of FIG. 2C(2). An example of the first reference voltage is VSS in FIG. 2C(2). From block 602, flow proceeds to block 604.

At block 604, a shunting device is coupled between an input of the protected device and the first reference voltage. An example of the shunting device is transistor N242 of FIG. 2C(2), which is coupled between the gate terminal of transistor N222 and ground. From block 604, flow proceeds to block 608.

At block 508, a feedback control circuit is coupled between the first node and an input of the shunting device. An example of the feedback control circuit is feedback control circuit 212C(2) of FIG. 2C(2), which is coupled between node 206 and the gate terminal of transistor N242 of FIG. 2C(2).

In some embodiments, block 608 includes block 620. At block 620, the feedback control circuit is used to provide the first reference voltage, or if present then the ESD voltage on the first node, to the input of the shunting device. An example of this is the electrical path in FIG. 2C(2) which includes node 206, resistor 230, transistor P228, node 232 and the gate terminal of transistor N242. From block 620, flow exits block 608. From block 608, flow proceeds to block 610.

At block 610, the shunting device is used to actively couple the input of the protected device to the first reference voltage. An example of such active coupling is transistor N242 actively pulling the gate terminal of transistor N222 to ground in FIG. 2C(2).

Figure 7:
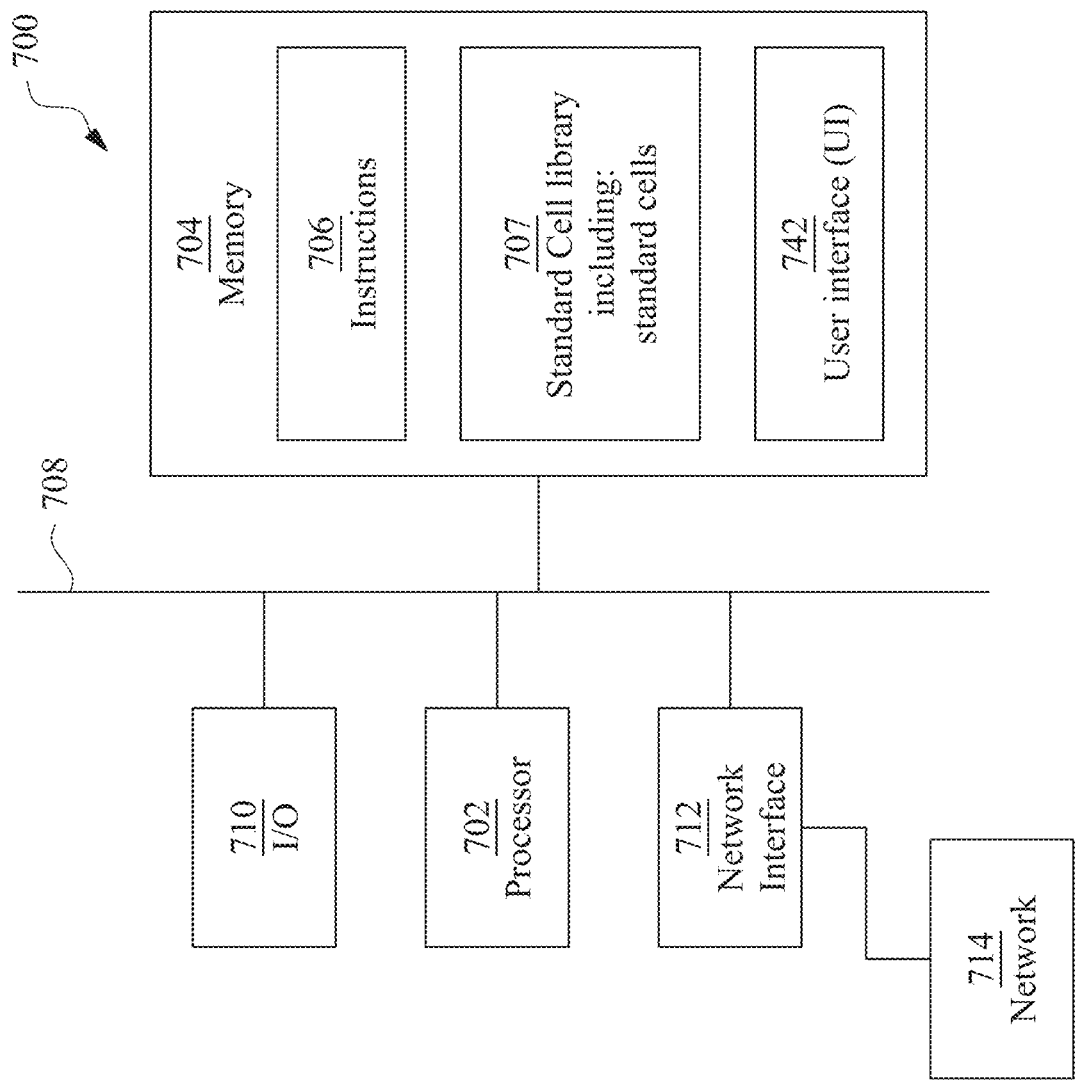
FIG. 7 is a block diagram of an electronic design automation (EDA) system, in accordance with some embodiments.

FIG. 7 is a block diagram of an electronic design automation (EDA) system 700, in accordance with some embodiments.

In some embodiments, EDA system 700 includes an APR system. Methods described herein, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium (memory) 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of the methods described herein in accordance with one or more embodiments (hereinafter, the noted processes and/or methods).

Processor 702 is electrically coupled to memory 704 via a bus 708. Processor 702 is also electrically coupled to an I/O interface 710 by bus 708. A network interface 712 is also electrically coupled to processor 702 via bus 708. Network interface 712 is coupled to a network 714, so that processor 702 and memory 704 are capable of connecting to external elements via network 714. Processor 702 is configured to execute instructions 706 encoded in memory 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, memory 704 is an electronic, magnetic, optical, electromagnetic, infrared, and/or a semiconductor system (or apparatus or device). For example, memory 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, memory 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein. In one or more embodiments, storage medium 704 stores one or more layout diagrams 709.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are coupled. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in memory 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
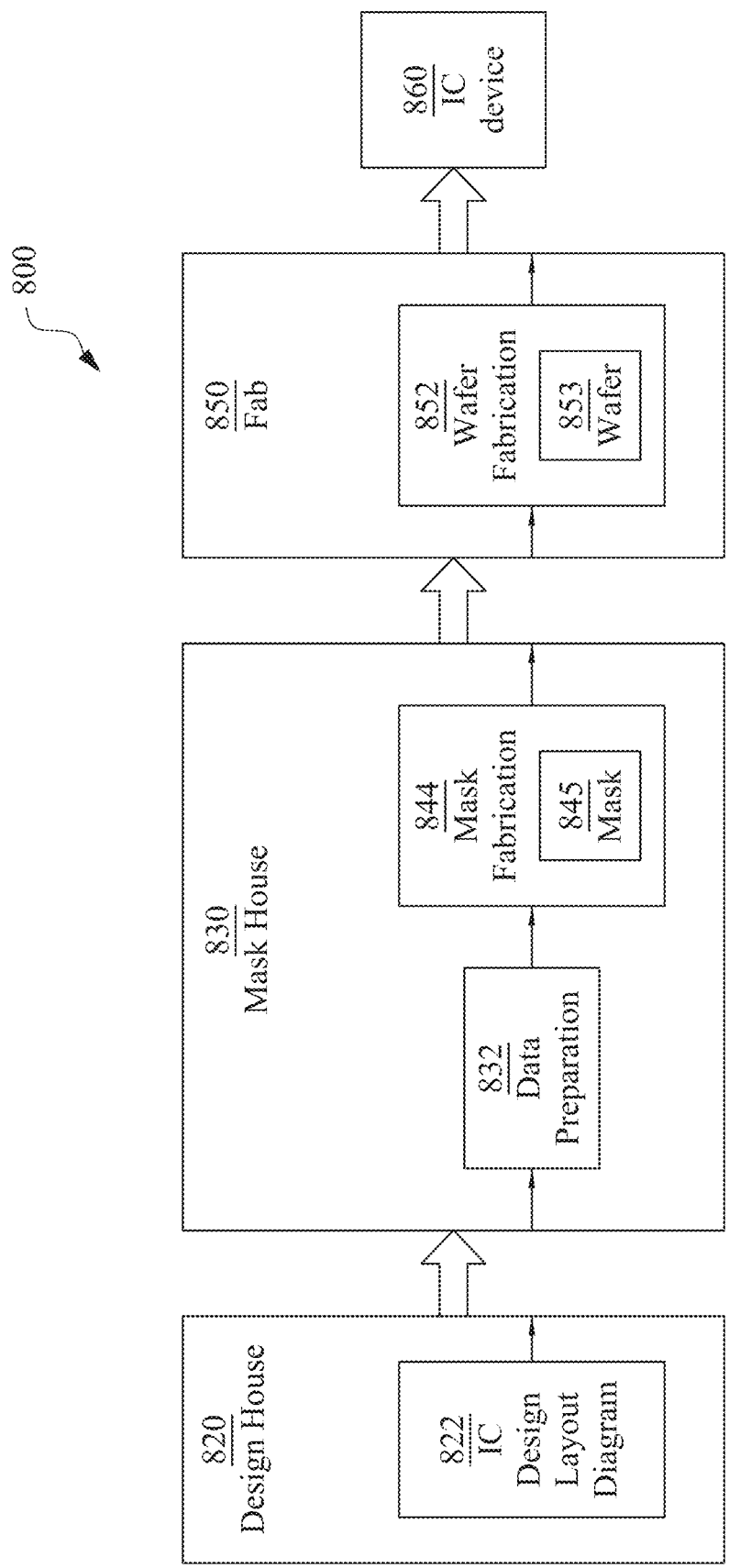
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a systems and methods described herein, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are coupled by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and published Feb. 6, 2014, and U.S. Pat. No. 7,260,442, granted Aug. 21, 2007, the entireties of each of which are hereby incorporated by reference.

In an embodiment, an electrostatic discharge (ESD) protection circuit (for a protected device in a semiconductor system, the protected device being coupled between a first node and a first reference voltage) includes: an ESD device coupled between the first node and the first reference voltage; a logic block including a first input and an output, the first input being coupled to a second reference voltage, and the output being coupled to an input of the ESD device and a feedback control circuit coupled between the first node and a second input of the logic block. In an embodiment, the logic block is configured to actively couple the input of the ESD device to the second reference voltage. In an embodiment, the logic block is a NOR gate. In an embodiment, the first node is an input/output (I/O) pad of the semiconductor system; the first reference voltage is VSS; the second reference voltage is VDD; the ESD device is an NMOS transistor; and the NMOS transistor has a substantially larger channel arrangement than is typical of a majority of other NMOS transistors of the semiconductor system. In an embodiment, the feedback control circuit includes a resistor and a first PMOS transistor coupled in series between the first node and a second node, a second NMOS transistor coupled in series between the second node and a third node, and a third NMOS transistor coupled in series between the third node and the first reference voltage; and a gate terminal of each of the first PMOS transistor, the second NMOS transistor and the third NMOS transistor is coupled to a control signal. In an embodiment, in an ESD event, an ESD voltage is arranged to be provided on the first node; and the feedback control circuit is configured to provide the first reference voltage, or if present then the ESD voltage, to the second input of the logic block. In an embodiment, the ESD protection circuit further includes: a shunting device coupled between an input of the protected device and the second reference voltage; and the feedback control circuit also is coupled between the first node and an input of the shunting device. In an embodiment, the shunting device is an NMOS transistor. In an embodiment, in an ESD event, an ESD voltage is arranged to be provided on the first node; and the feedback control circuit is configured to provide the first reference voltage, or if present then the ESD voltage, to the input of the shunting device.

In an embodiment, a method of protecting a device (protected device) (in a semiconductor system, from an electrostatic discharge (ESD), the protected device being coupled between a first node and a first reference voltage) includes: coupling an ESD device between the first node and the first reference voltage; coupling a first input of a logic block to a second reference voltage; coupling an output of the logic block to an input of the ESD device; coupling a feedback control circuit between the first node and a second input of the logic block; and using the logic block to actively couple the input of the ESD device to the second reference voltage. In an embodiment, the first node is an input/output (I/O) pad of the semiconductor system; the first reference voltage is VSS; the second reference voltage is VDD; and the ESD device is an NMOS transistor; and the NMOS transistor has a substantially larger channel arrangement than is typical of a majority of other NMOS transistors of the semiconductor system. In an embodiment, the coupling the feedback control circuit includes: coupling a resistor and a first PMOS transistor in series between the first node and a second node; coupling a second NMOS transistor in series between the second node and a third node; and a third NMOS transistor coupled in series between the third node and the first reference voltage; and coupling each of a gate terminal of each of the first PMOS transistor, the second NMOS transistor and the third NMOS transistor to a control signal. In an embodiment, in an ESD event, an ESD voltage is arranged to be provided on the he first node; and the coupling the feedback control circuit further includes: using the feedback control circuit to provide the first reference voltage, or if present then the ESD voltage, to the second input of the logic block. In an embodiment, the method further includes: configuring the logic block to function as a NOR gate. In an embodiment, the method further includes: coupling a shunting device between an input of the protected device and the first reference voltage; and coupling the feedback control circuit also between the first node and an input of the shunting device. In an embodiment, the shunting device is an NMOS transistor; in an ESD event, an ESD voltage is arranged to be provided on the he first node; and the coupling the feedback control circuit further includes using the feedback control circuit to provide the first reference voltage, or if present then the ESD voltage, to the shunting device.

In an embodiment, an electrostatic discharge (ESD) protection circuit (for a protected device in a semiconductor system, the protected device being coupled between a first node and a first reference voltage) includes: an ESD device coupled between the first node and the first reference voltage; a shunting device coupled between an input of the protected device and the first reference voltage; and a feedback control circuit coupled between the first node and an input of the shunting device. In an embodiment, the shunting device is an NMOS transistor. In an embodiment, an input of the ESD device is coupled to the first reference voltage. In an embodiment, the feedback control circuit is configured to use an ESD signal on the first node to turn on the shunting device; and the shunting device is configured to actively couple the protected device to the first reference voltage.

In an embodiment, a method of protecting a device (protected device) (in a semiconductor system from an electrostatic discharge (ESD), the protected device being coupled between a first node and a first reference voltage) includes: coupling an ESD device between the first node and the first reference voltage; coupling a shunting device between an input of the protected device and the first reference voltage; coupling a feedback control circuit between the first node and an input of the shunting device; and using the shunting device to actively couple the input of the protected device to the first reference voltage.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An electrostatic discharge (ESD) protection circuit for a protected device in a semiconductor system, the protected device being coupled between a first node and a first reference voltage, the ESD protection circuit comprising:
   an ESD device coupled between the first node and the first reference voltage;
   a logic block including a first input and an output, the first input being coupled to a second reference voltage, and the output being coupled to an input of the ESD device; and
   a feedback control circuit coupled between the first node and a second input of the logic block.

2. The ESD protection circuit of claim 1, wherein:
   the logic block is configured to actively couple the input of the ESD device to the second reference voltage.

3. The ESD protection circuit of claim 2, wherein:
   the logic block is a NOR gate.

4. The ESD protection circuit of claim 1, wherein:
   the first node is an input/output (I/O) pad of the semiconductor system;
   the first reference voltage is VSS;
   the second reference voltage is VDD;
   the ESD device is an NMOS transistor; and
   the NMOS transistor has a substantially larger channel arrangement than is typical of a majority of other NMOS transistors of the semiconductor system.

5. The ESD protection circuit of claim 1, wherein:
   the feedback control circuit includes:
      a resistor and a first PMOS transistor coupled in series between the first node and a second node;
      a second NMOS transistor coupled in series between the second node and a third node; and
      a third NMOS transistor coupled in series between the third node and the first reference voltage; and
   a gate terminal of each of the first PMOS transistor, the second NMOS transistor and the third NMOS transistor being coupled to a control signal.

6. The ESD protection circuit of claim 1, wherein:
   in an ESD event, an ESD voltage is arranged to be provided on the first node; and
   the feedback control circuit is configured to provide the first reference voltage, or if present then the ESD voltage, to the second input of the logic block.

7. The ESD protection circuit of claim 1, wherein:
   the ESD protection circuit further comprises:
      a shunting device coupled between an input of the protected device and the second reference voltage; and
   the feedback control circuit also is coupled between the first node and an input of the shunting device.

8. The ESD protection circuit of claim 7, wherein:
   the shunting device is an NMOS transistor.

9. The ESD protection circuit of claim 7, wherein:
   in an ESD event, an ESD voltage is arranged to be provided on the first node; and
   the feedback control circuit is configured to provide the first reference voltage, or if present then the ESD voltage, to the input of the shunting device.

10. A method of protecting a device (protected device) in a semiconductor system, from an electrostatic discharge (ESD), the protected device being coupled between a first node and a first reference voltage, the method comprising:
    coupling an ESD device between the first node and the first reference voltage;
    coupling a first input of a logic block to a second reference voltage;
    coupling an output of the logic block to an input of the ESD device;
    coupling a feedback control circuit between the first node and a second input of the logic block; and
    using the logic block to actively couple the input of the ESD device to the second reference voltage.

11. The method of claim 10, wherein:
    the first node is an input/output (I/O) pad of the semiconductor system;
    the first reference voltage is VSS;
    the second reference voltage is VDD; and
    the ESD device is an NMOS transistor; and
    the NMOS transistor has a substantially larger channel arrangement than is typical of a majority of other NMOS transistors of the semiconductor system.

12. The method of claim 10, wherein:
    the coupling the feedback control circuit includes:
       coupling a resistor and a first PMOS transistor in series between the first node and a second node;
       coupling a second NMOS transistor in series between the second node and a third node; and
       a third NMOS transistor coupled in series between the third node and the first reference voltage; and
    coupling each of a gate terminal of each of the first PMOS transistor, the second NMOS transistor and the third NMOS transistor to a control signal.

13. The method of claim 12, wherein: in an ESD event, an ESD voltage is arranged to be provided on the first node; and the coupling the feedback control circuit further includes: using the feedback control circuit to provide the first reference voltage, or if present then the ESD voltage, to the second input of the logic block.

14. The method of claim 10, further comprising:
    configuring the logic block to function as a NOR gate.

15. The method of claim 10, wherein the method further comprises:
    coupling a shunting device between an input of the protected device and the first reference voltage; and
    coupling the feedback control circuit also between the first node and an input of the shunting device.

16. The method of claim 15, wherein: the shunting device is an NMOS transistor; in an ESD event, an ESD voltage is arranged to be provided on the first node; and the coupling the feedback control circuit further includes: using the feedback control circuit to provide the first reference voltage, or if present then the ESD voltage, to the shunting device.

17. An electrostatic discharge (ESD) protection circuit for a protected device in a semiconductor system, the protected device being coupled between a first node and a first reference voltage, the ESD protection circuit comprising:
   an ESD device coupled between the first node and the first reference voltage;
   a shunting device coupled between an input of the protected device and the first reference voltage; and
   a feedback control circuit coupled between the first node and an input of the shunting device.

18. The ESD protection circuit of claim 17, wherein:
the shunting device is an NMOS transistor.

19. The ESD protection circuit of claim 17, wherein:
an input of the ESD device is coupled to the first reference voltage.

20. The ESD protection circuit of claim 17, wherein:
the feedback control circuit is configured to use an ESD signal on the first node to turn on the shunting device; and
the shunting device is configured to actively couple the protected device to the first reference voltage.

* * * * *